(12) United States Patent
Santos et al.

(10) Patent No.: US 9,645,172 B2
(45) Date of Patent: May 9, 2017

(54) CABLE ASSEMBLY

(71) Applicant: Samtec, Inc., New Albany, IN (US)

(72) Inventors: Robert Marine Santos, Wilsonville, OR (US); Jon Reiner Hoffman, West Linn, OR (US); Travis Scott Ellis, Portland, OR (US); William Chieng Ouyang, New Albany, IN (US)

(73) Assignee: SAMTEC, INC., New Albany, NY (US)

( * ) Notice: Subject to any disclaimer, the term of this patent is extended or adjusted under 35 U.S.C. 154(b) by 0 days.

(21) Appl. No.: 14/511,256

(22) Filed: Oct. 10, 2014

(65) Prior Publication Data

US 2016/0104956 A1 Apr. 14, 2016

(51) Int. Cl.
*G01R 31/20* (2006.01)
*H01R 33/945* (2006.01)
(Continued)

(52) U.S. Cl.
CPC ......... *G01R 1/0416* (2013.01); *H01R 9/0518* (2013.01); *H01R 13/2414* (2013.01);
(Continued)

(58) Field of Classification Search
CPC .. H01R 9/0527; H01R 11/18; H01R 13/2421; H01R 2201/20; H01R 9/0518;
(Continued)

(56) References Cited

U.S. PATENT DOCUMENTS

| | | |
|---|---|---|
| 5,190,472 A | 3/1993 | Voltz et al. |
| 5,194,020 A | 3/1993 | Voltz |

(Continued)

FOREIGN PATENT DOCUMENTS

| | | |
|---|---|---|
| TW | I368742 B1 | 7/2012 |
| TW | M468822 U | 12/2013 |

(Continued)

OTHER PUBLICATIONS

Samtec, "100Ω Shielded Twisted Pair System", http://www.samtec.com, Apr. 2011, 1 page.

(Continued)

*Primary Examiner* — Farhana Hoque
(74) *Attorney, Agent, or Firm* — Keating & Bennett, LLP

(57) ABSTRACT

A connector includes a connector body including a hole, a contact disposed in the hole and arranged such that, when the connector is connected to a substrate, the contact is connected to a corresponding electrical pad on the substrate, a conductive elastomeric interface arranged such that, when the connector is connected to the substrate, the conductive elastomeric interface is between the connector body and the substrate, and a cable connected to the contact. The contact includes a ground ferrule and a locking ferrule arranged to mate with the hole, and the hole of the connector body and the locking ferrule are at least partially threaded. When the connector is connected to the substrate and when the locking ferrule is threaded with the hole, the ground ferrule contacts at least one of the conductive elastomeric interface and the upper surface of the substrate.

27 Claims, 19 Drawing Sheets

(51) Int. Cl.
*G01R 1/04* (2006.01)
*H01R 13/24* (2006.01)
*H01R 9/05* (2006.01)
*H01R 11/18* (2006.01)
*H01R 12/71* (2011.01)
*G01R 1/067* (2006.01)

(52) U.S. Cl.
CPC ..... H01R 13/2421 (2013.01); *G01R 1/06722* (2013.01); *H01R 11/18* (2013.01); *H01R 12/714* (2013.01); *H01R 2201/20* (2013.01)

(58) Field of Classification Search
CPC .. H01R 12/714; H01R 13/2414; G01R 1/067; G01R 1/0416; G01R 1/06722
USPC ........... 324/750.25, 754.11, 754.03; 439/577
See application file for complete search history.

(56) References Cited

U.S. PATENT DOCUMENTS

| | | | |
|---|---|---|---|
| 6,261,130 | B1 | 7/2001 | Huynh et al. |
| 7,544,093 | B2* | 6/2009 | Soubh .................... H01R 9/038 439/581 |
| 8,337,256 | B1 | 12/2012 | Lin |
| 2010/0255690 | A1* | 10/2010 | Waite ................. G01R 1/06772 439/65 |
| 2013/0319761 | A1* | 12/2013 | Furukawa .............. H01R 4/185 174/74 R |
| 2015/0147911 | A1* | 5/2015 | Logan, Jr. .............. H01R 12/91 439/577 |
| 2015/0180182 | A1 | 6/2015 | Tatzel et al. |
| 2016/0104956 | A1 | 4/2016 | Santos et al. |

FOREIGN PATENT DOCUMENTS

| | | |
|---|---|---|
| TW | M472844 U | 2/2014 |
| TW | M521829 U | 5/2016 |

OTHER PUBLICATIONS

Huber+Suhner, "MMPX and MXP PCB Connector Assembling, Application Note", http://www.hubersuhner.com/en/Documents/MMPX-and-MXP-PCB-Connector-Assembling-en.pdf, retrieved Jun. 27, 2014, 4 pages.

Interconnect Devices, Inc., "Coax Probes Attached Cable", http://idinet.com/IdiNet/media/PDF/96.pdf?ext=.pdf, retrieved Aug. 13, 2014, 1 page.

Mill-Max, "Mill-Max Spring-loaded Connectors Minimize Noise", https://www.mill-max.com/assets/new_products/PR561%20new.pdf, retrieved Jun. 27, 2014, 11 pages.

Samtec, "BullsEye", https://www.samtec.com/Documents/webfiles/current_literature/bullseyeflyer.pdf, retrieved Jun. 27, 2014, 1 page.

Official Communication issued in corresponding Taiwanese Patent Application No. 104123065, mailed on Nov. 23, 2016.

* cited by examiner

CABLE ASSEMBLY

BACKGROUND OF THE INVENTION

1. Field of the Invention

The present invention relates to electrical connectors. More specifically, the present invention relates to pogo pin-type coaxial and twinaxial connectors.

2. Description of the Related Art

One known connector used with automatic testing equipment includes a sub-connector that has pogo pins soldered to both sides of a circuit board. Sub-connectors are arranged into an array to form the connector. Pogo pins include a socket, a pin that is partially disposed in the socket, and a spring disposed in the socket that pushes the pin away from the socket. This arrangement allows the pogo pins to travel within the socket.

Conventional pogo pins suffer from several drawbacks. First, the pogo pins are relatively long. Because pogo pins are relatively long, it is difficult to design a compact connector. Also, the length of the pogo pins often causes significant portions of the pogo pins to be unshielded, which results in impedance discontinuities, attenuation, and low signal integrity. Second, pogo pins are expensive because of the difficulties in their manufacturing and tight tolerances for many of the components of the pogo pins. Third, the total downward force required to engage all of the pogo pins with the mating circuit board is quite large due to variances in the dimensions of the pogo pins, particularly the exposed length of the pogo pin which requires the spring to have a high spring constant. Fourth, it is difficult to ensure proper impedance matching of the connectors due to unshielded portions of the pogo pins and variances in the dimensions of the pogo pins. Fifth, conventional pogo pins are often connected to cables by receptacles, rather than solder, which further increases the difficulties in providing consistent impedances among electrical connectors.

FIGS. 19 and 20 show a conventional pogo pin connector 110 disclosed in U.S. Pat. No. 6,261,130. As shown in FIG. 19, pogo pins 114a, 114b, and 114c of the pogo pin connector 110 have significantly different lengths, which increases the mating force required to ensure that all of the pogo pins 114 are mated with their corresponding contact regions 118. For example, a spring of the pogo pin 114b is compressed further than a spring of the pogo pin 114c when the pogo pings 114 are mated with their corresponding contact regions 114. Further, as shown in FIG. 20, a significant portion of each of the pogo pins 114 is exposed when the pogo pins 114 are mated with their corresponding contact regions 118, resulting in impedance discontinuities, attenuation, and low signal integrity.

FIG. 21 shows a conventional pogo pin contact 120 disclosed in U.S. Pat. No. 8,337,256. As shown in FIG. 21, the pogo pins 121 of the pogo pin contact 120 include springs 122 that provide a compressive force to mechanically mate the pogo pins 121 with corresponding contact regions of a circuit board or contact section of a connector. However, because the pogo pin contact 120 relies on the force of the springs 122, the pogo pins 121 are subject to swaying or misalignment due to the lack of any guide or support elements near the tips of the pogo pins 121. Further, a significant portion of each of the pogo pins 121 is exposed, resulting in impedance discontinuities, attenuation, and low signal integrity.

Thus, known connectors that include pogo pins typically have impedance discontinuities, attenuation, and low signal integrity in the termination region, that is, in the area where pogo pins are connected to a circuit board or other electrical components within the transceiver. More specifically, since pogo pins provide an exposed portion of the conductor along which a signal is transmitted, shielding elements of the connectors do not cover the entire length of the signal transmission distance. The exposed (unshielded) portions of the pogo pins allows the pogo pins to receive excessive external noise and crosstalk from neighboring pogo pins, as well as impedance discontinuities, attenuation, and low signal integrity.

FIG. 22 is a side view of a conventional pogo pin connector 130 with a spring-loaded shield 135. As shown in FIG. 22, one known method to reduce the negative effects of the unshielded portions of the conventional pogo pin 132 of the pogo pin connector 130 is to include the spring-loaded shield 135, which surrounds the pogo pin 132 and compresses along with the pogo pin 132 during mating. However, although this arrangement reduces the unshielded portion of the pogo pin 132, the spring-loaded shield 135 typically only provides a marginal improvement in signal integrity over simply allowing the unshielded portion of the pogo pin 132 to remain exposed. Further, the spring-loaded shield 135 increases the complexity and cost of the pogo pin connector 130 and introduces structurally weak connections into the pogo pin connector 130, particularly between the pogo pin 132 and the signal conductor 133 and between the spring-loaded shield 135 and the shield sheath 136. The spring-loaded shield 135 also typically has a relatively large diameter that reduces the density of the pogo pin connector 130 and requires a dielectric insulator 137 be included between the signal conductor 133 and the shield sheath 136.

Conventional pogo pin connectors have also included springs that are externally located to provide a compressive force to mechanically mate the pogo pin connectors with a connector body, circuit board, or the like. However, these external springs are typically formed of metal, and thus introduce capacitances and inductances that negatively affect the signal integrity of signals passing through the pogo pin connectors, even if the external springs are specially cut or formed to connect to ground or a shield conductor. External springs also reduce the density of pogo pin connectors.

SUMMARY OF THE INVENTION

To overcome the problems described above, preferred embodiments of the present invention provide high-density coaxial and twinaxial connectors with stable and consistent signal characteristics.

A connector according to a preferred embodiment of the present invention includes a connector body including a hole, a contact disposed in the hole and arranged such that, when the connector is connected to a substrate, the contact is connected to a corresponding electrical pad on the substrate, a conductive elastomeric interface arranged such that, when the connector is connected to the substrate, the conductive elastomeric interface is between the connector body and the substrate, and a cable connected to the contact, wherein the contact includes a ground ferrule and a locking ferrule arranged to mate with the hole, the hole of the connector body is at least partially threaded, the locking ferrule is at least partially threaded, and, when the connector is connected to the substrate and when the locking ferrule is threaded with the hole, the ground ferrule contacts at least one of the conductive elastomeric interface and the upper surface of the substrate.

The contact preferably includes a signal probe connected to a conductor of the cable.

The signal probe is preferably located along or substantially along a central longitudinal axis of the ground ferrule. Preferably, the contact includes a positioning puck that is arranged within the ground ferrule near an end of the ground ferrule that receives the cable, and the positioning puck at least partially surrounds the conductor of the cable. The contact preferably includes a dielectric puck that is arranged within the ground ferrule near an end of the ground ferrule opposite to an end of the ground ferrule that receives the cable, and the dielectric puck preferably at least partially surrounds the signal probe. Preferably, at least one hole is formed in the dielectric puck other than a hole formed to receive the signal probe.

The signal probe preferably includes a probe tip that at least partially extends, in a longitudinal direction, beyond a plane formed by an end of the ground ferrule that is opposite to an end of the ground ferrule that receives the cable. The probe tip preferably at least partially retracts into the contact when the connector is connected to the substrate and the contact is connected to the corresponding electrical pad. The probe tip preferably at least partially retracts into the contact due to a compressive stress between the signal probe and the corresponding electrical pad. Preferably, the signal probe includes a probe spring, and the signal probe at least partially extends beyond the plane formed by the end of the ground ferrule due to a spring force of the probe spring.

The cable preferably is a coaxial cable that includes a center conductor, an insulator, and an external conductor. Preferably, the contact includes a signal probe connected to the center conductor, and the ground ferrule is connected to the external conductor. The signal probe and the ground ferrule are preferably have a coaxial structure. The signal probe is preferably soldered to the center conductor and the ground ferrule is preferably soldered to the external conductor.

Alternatively, the cable is preferably a twinaxial cable that includes a first center conductor, a second center conductor, an insulator, and an external conductor. Preferably, the contact includes a first signal probe connected to the first center conductor and a second signal probe connected to the second center conductor, and the ground ferrule is connected to the external conductor. The first signal probe, the second signal probe, and the ground ferrule are preferably arranged to form a twinaxial structure. The first signal probe is preferably soldered to the first center conductor, the second signal probe is preferably soldered to the second center conductor, and the ground ferrule is preferably soldered to the external conductor. Preferably, the first signal probe is arranged to connect to a first electrical pad on the substrate, and the second signal probe is arranged to connect to a second electrical pad on the substrate.

Preferably, the contact includes an indented portion, the hole of the connector body includes a protruding portion, and, when the contact is inserted into the hole of the connector body, the indented portion engages the protruding portion to orient the contact within the hole so that the first and second signal probes are respectively arranged to connect to the first and second electrical pads on the substrate.

At least a portion of the contact is preferably located in the conductive elastomeric interface. Preferably, the conductive elastomeric interface is connected to a ground plane or ground connection of the substrate.

Preferably, the connector body includes at least one hole, and at least one screw inserted into a corresponding one of the at least one hole attaches the connector body to the substrate. The at least one hole preferably includes a plurality of holes that are arranged such that an equal or substantially equal compression force is provided throughout the connector when the connector body is attached to the substrate.

A second end of the cable is preferably connected to an end connector. The connector is preferably included in a connector assembly that also includes test equipment, and the end connector is preferably connected to the test equipment.

A connector according to another preferred embodiment of the present invention includes a connector body including a plurality of holes, a plurality of contacts each disposed in a corresponding one of the plurality of holes and arranged such that, when the connector is connected to a substrate, each of the plurality of contacts is connected to a corresponding one of a plurality of electrical pads on the substrate, a conductive elastomeric interface arranged such that, when the connector is connected to the substrate, the conductive elastomeric interface is between the connector body and the substrate, and a plurality of cables each connected to one of the plurality of contacts, wherein each of the plurality of contacts includes a ground ferrule and a locking ferrule arranged to mate with the corresponding one of the plurality of holes, the plurality of holes of the connector body are at least partially threaded, the locking ferrule of each of the plurality of contacts is at least partially threaded, and, when the connector is connected to the substrate and when the locking ferrule each of the plurality of contacts is threaded with the corresponding one of the plurality of holes, the ground ferrule of each of the plurality of contacts engages at least one of the conductive elastomeric interface and the upper surface of the substrate.

The above and other features, elements, steps, configurations, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
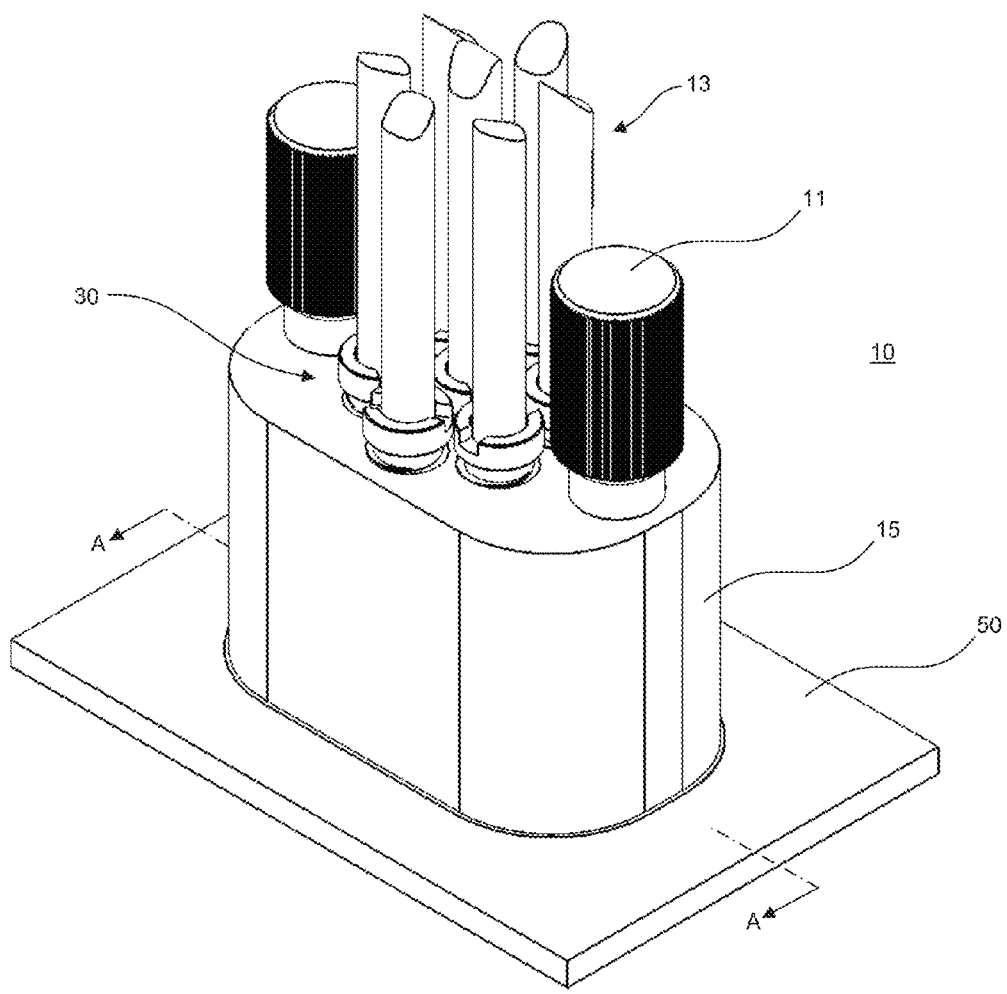
FIG. 1 is a perspective view of a coaxial connector according to a first preferred embodiment of the present invention.

Preferred embodiments of the present invention will now be described in detail with reference to FIGS. 1 to 18. Note that the following description is in all aspects illustrative and not restrictive and should not be construed to restrict the applications or uses of the present invention in any manner.

FIGS. 1 to 5 show a coaxial connector 10 in accordance with a first preferred embodiment of the present invention, and FIGS. 6 to 10 show a coaxial contact 30 and a coaxial cable 13. FIGS. 11A and 11B are top and bottom planar views of the substrate according to the first preferred embodiment of the present invention.

As shown in FIGS. 1 to 5, the coaxial connector 10 includes coaxial cables 13, coaxial contacts 30, and a connector body 15.

Figure 2:
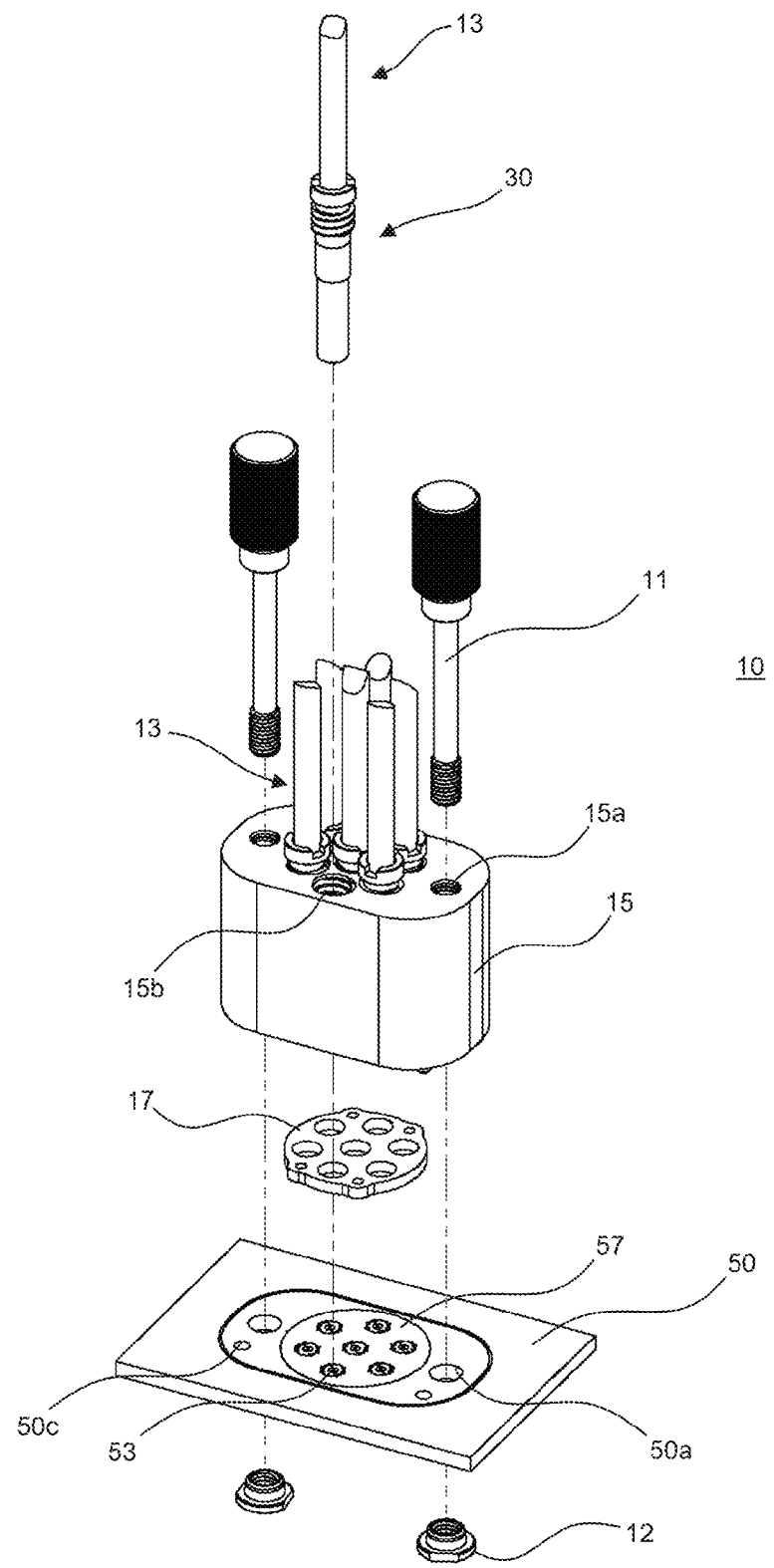
FIGS. 2 and 3 are exploded perspective views of the coaxial connector shown in FIG. 1.
Figure 3:
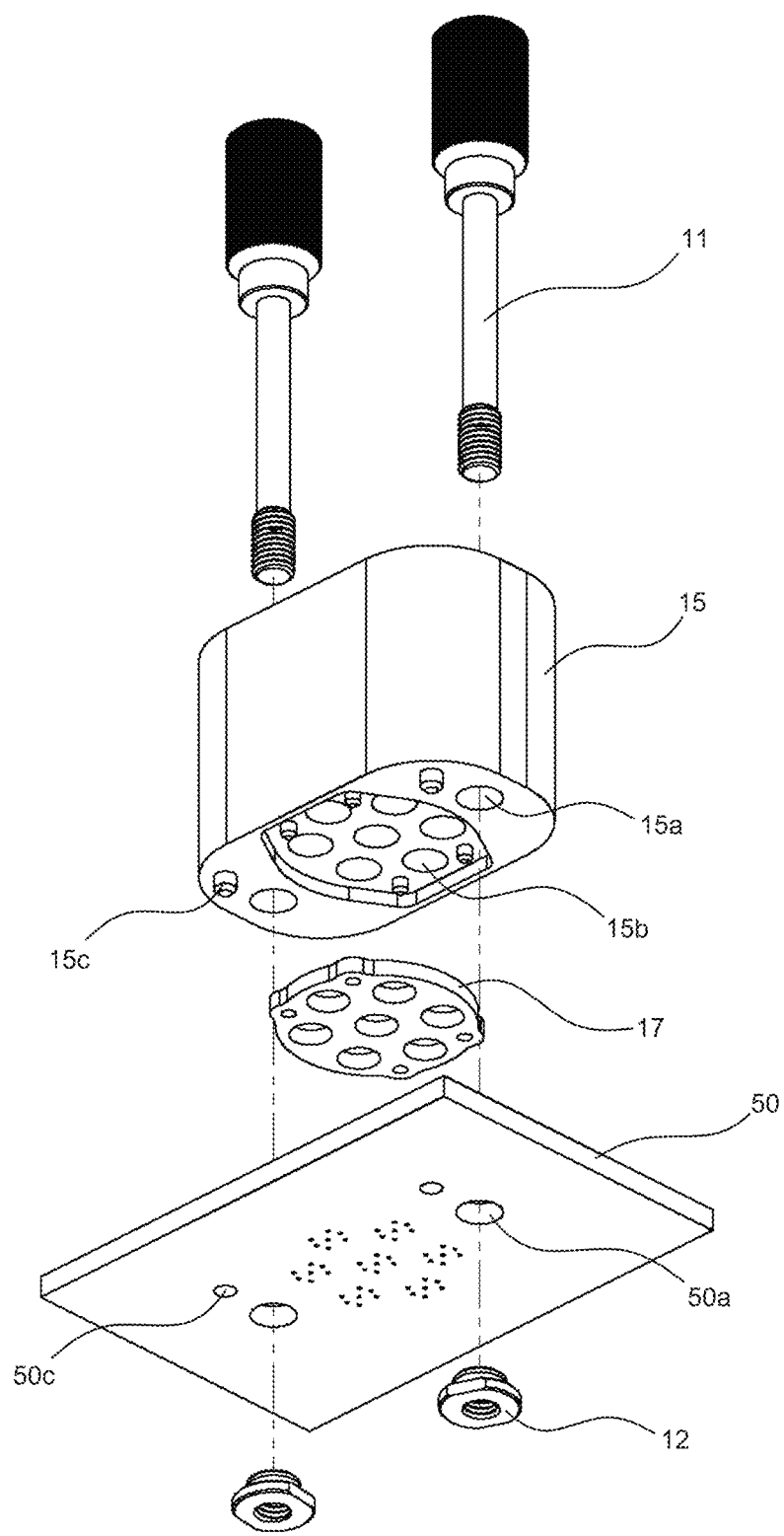

FIG. 1 is a perspective view of the coaxial connector 10. The connector body 15 of the coaxial connector 10 is attached to a substrate 50. The substrate 50 is preferably a printed circuit board, but other suitable substrates could be used. The connector body 15 is preferably attached to the substrate 50 by a pair of thumb screws 11 and bosses 12, as shown in FIGS. 2 and 3. However, only one thumb screw could be used, or more than two could be used. Preferably, the thumb screws 11 are externally threaded at a lower portion thereof (not shown), and the bosses 12 are standoffs that are internally threaded (not shown) and press fit to the substrate 50. However, any other suitable attachment mechanism can also be used. For example, instead of using thumb screws 11 and bosses 12, the connector body 15 can be connected to the substrate 50 by rivets or any other suitable connecting method, including RF connectors, through-hole connectors, other threaded connectors, quarter-turn connectors, ratcheted thread locks, spring-loaded connectors, pull-back-to-unlatch connectors, and the like. The connector body 15 of the coaxial connector 10 preferably includes two screw holes 15a at opposing ends of the connector body 15 for retaining the thumb screws 11, and one or more contact holes 15b in the middle or substantially in the middle of the connector body 15 for retaining the coaxial contacts 30. This arrangement of holes in the connector body 15 allows for an equal or substantially equal compression force throughout the coaxial connector 10 when the connector body 15 is attached to the substrate 50 by the thumb screws 11 and bosses 12. However, it is possible to use different arrangements of the holes in the connector body 15. The substrate 50 includes holes 50a that are arranged in a similar manner as the screw holes 15a in the connector body 15, and includes contact points 53 that are aligned with the one or more holes 15b in the middle or substantially in the middle of the connector body 15 for retaining the coaxial contacts 30.

The bosses 12 are inserted into the holes 50a in the substrate 50, and the thumb screws 11 are inserted into screw holes 15a in the connector body 15 and screwed into the bosses 12. The bosses 12 are preferably pressed into the holes 50a of the substrate 50, which prevents the bosses 12 from turning when the thumb screws 11 are inserted and screwed into the bosses 12. Preferably, the bosses 12 have been tapped so that the thumb screws 11 are easily screwed into bosses 12.

Figure 4:
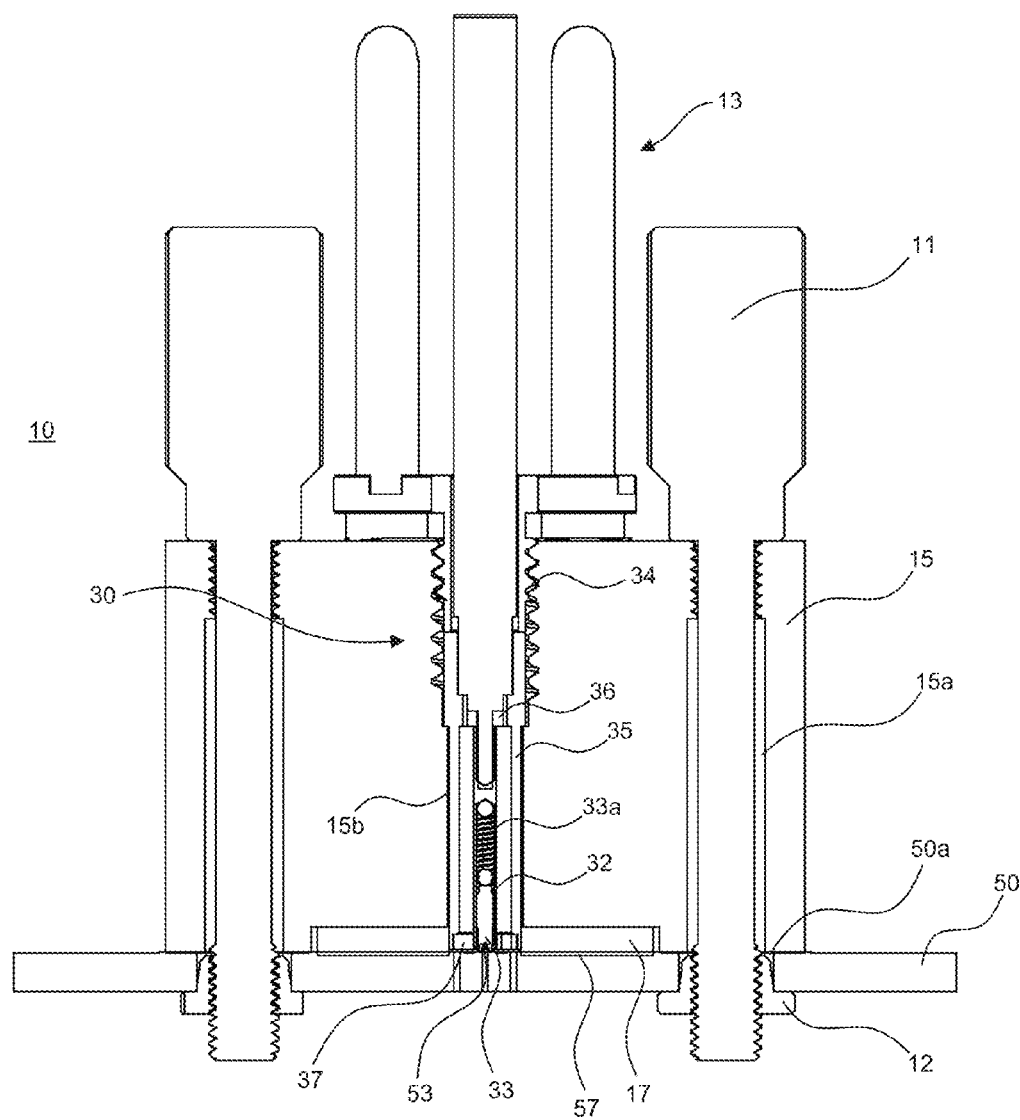
FIGS. 4 and 5 are cross-sectional views of the coaxial connector shown in FIG. 1.
Figure 5:
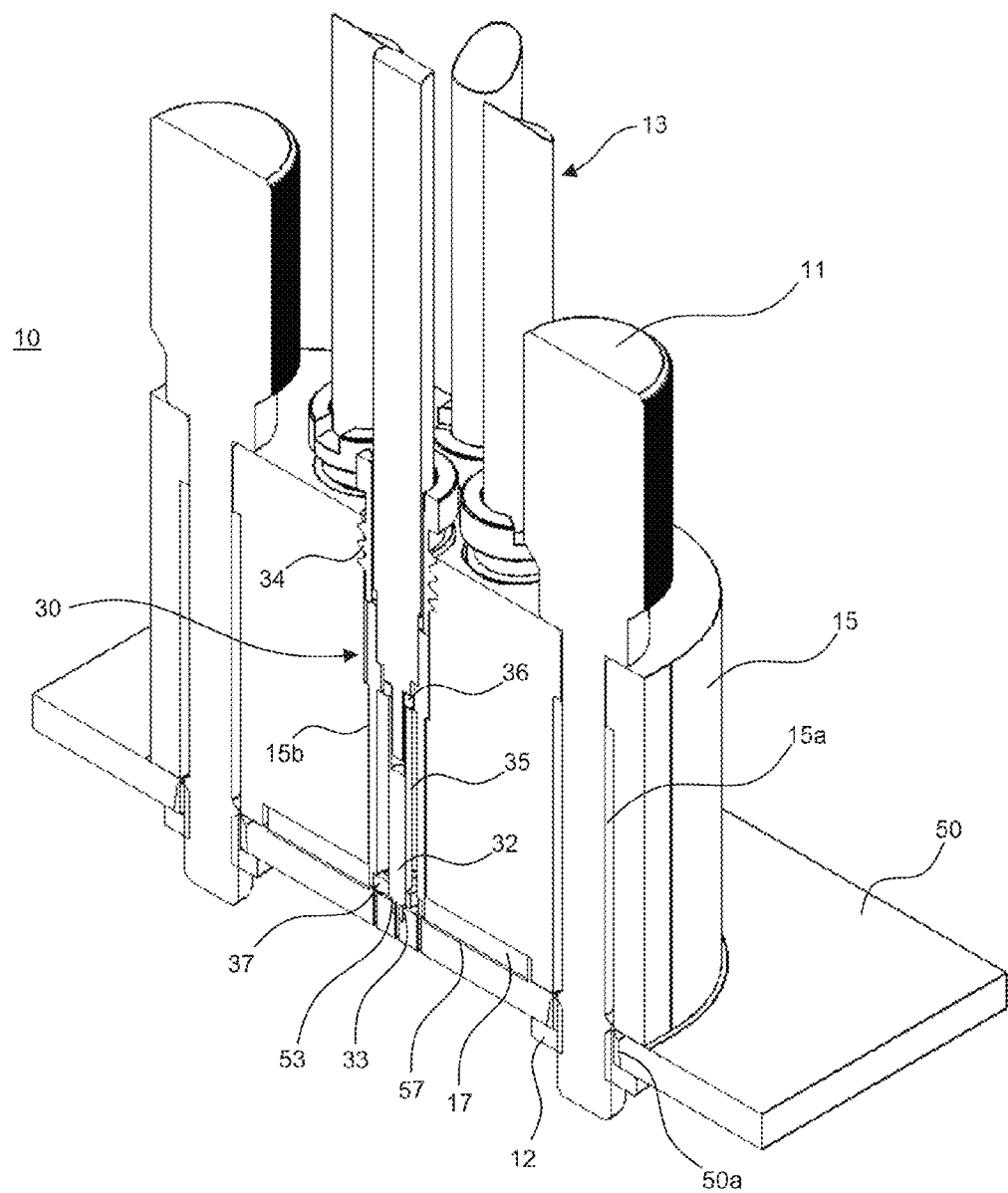

FIGS. 2 and 3 are exploded perspective views of the coaxial connector 10 shown in FIG. 1, and FIGS. 4 and 5 are cross-sectional views taken along line A-A of the coaxial connector 10 shown in FIG. 1. For the sake of clarity, the coaxial cables 13 and coaxial contacts 30 are not shown in FIG. 3 and the internal structure of the coaxial cables 13 is not shown in the cross-sectional views of FIGS. 4 and 5. An interface 17 including a conductive elastomeric material is preferably arranged between the connector body 15 and the substrate 50. The interface 17 is preferably fit in a recess of the connector body 15. Furthermore, the interface 17 preferably includes one or more holes arranged near the edges of the interface 17 that engage with corresponding posts of the connector body 15, and one or more holes in the middle or substantially in the middle of the interface 17 for retaining the coaxial contacts 30. However, any other suitable method of attaching the interface 17 to the connector body 15 can also be used. The interface 17 is preferably made of fluorosilicone with a filler of silver or aluminum particles with a Shore A hardness of about 70. However, other suitable materials, filler metals, and hardnesses can also be used. Preferably, the interface 17 is connected to a ground plane 57 included on an upper surface of the substrate 50. However, the interface 17 can also be connected to an external ground or another ground connection in the substrate 50.

As shown in FIGS. 11A and 11B, the ground plane 57 preferably includes one or more via holes 57' that penetrate through the substrate 50 and provide a connection to ground for the ground plane 57.

As shown in FIGS. 2, 3, 11A, and 11B, the connector body 15 and the substrate 50 preferably include corresponding pegs 15c and peg holes 50c that align the connector body 15 to the substrate 50 prior to the thumb screws 11 being screwed into the bosses 12. Preferably, the pegs 15c are arranged asymmetrically on the connector body 15 so that the connector body 15 is only able to be positioned on the substrate 50 in a single orientation and so that each coaxial contact 30 is arranged to connect with its corresponding contact point 53 on the substrate 50. The thumb screws 11 provide quick attachment and detachment of the coaxial connector 10 from the substrate 50, which allows the elements of the coaxial connector 10 to be easily replaced or repaired.

Figure 6:
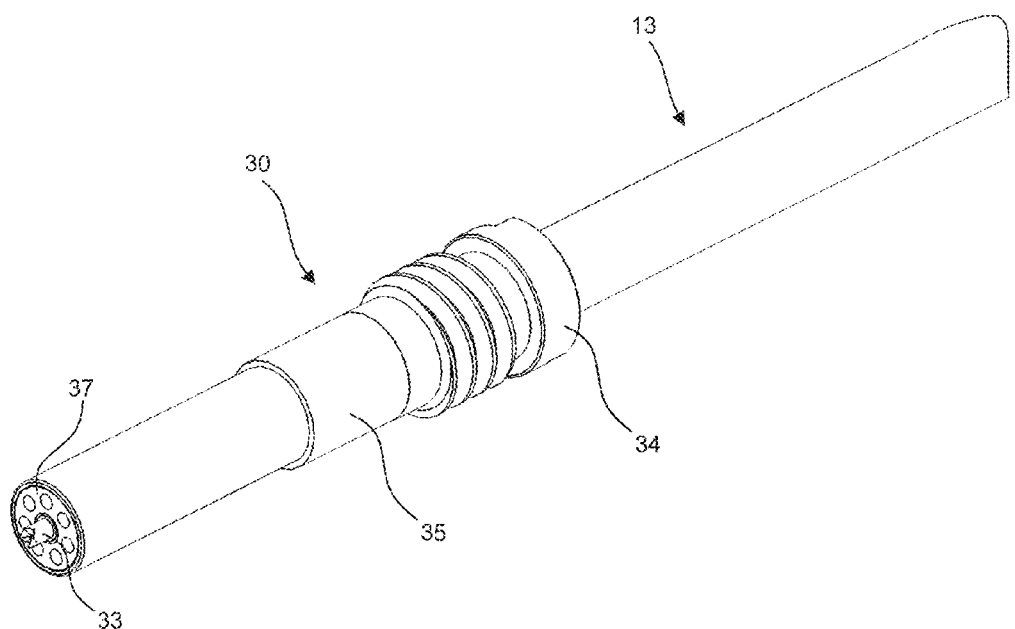
FIG. 6 is a perspective view of a coaxial contact and coaxial cable according to the first preferred embodiment of the present invention.
Figure 7:
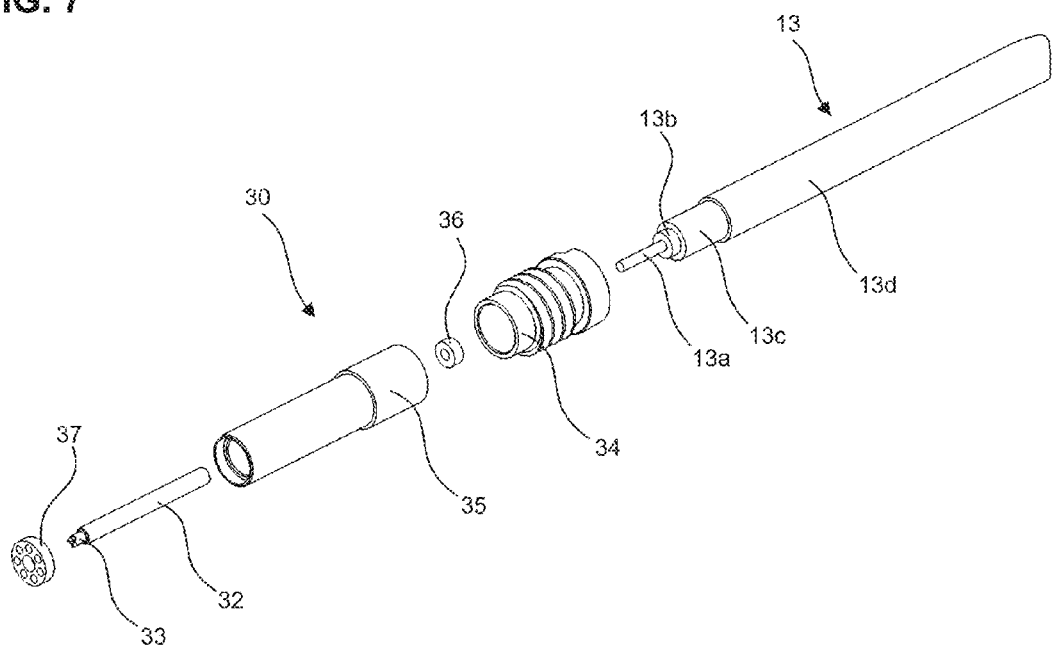
FIG. 7 is an exploded perspective view of the coaxial contact and the coaxial cable shown in FIG. 6.
Figure 8:
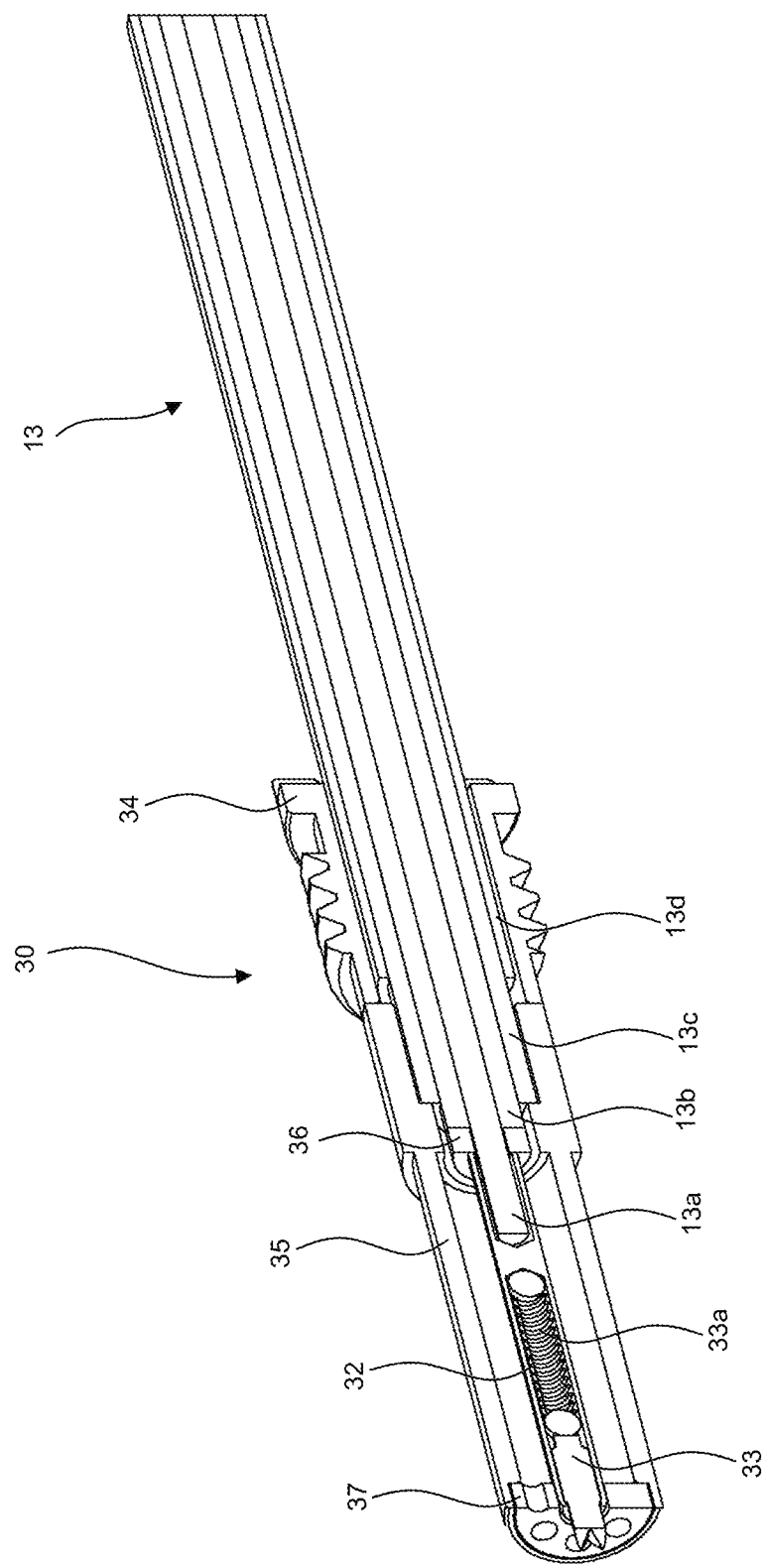
FIGS. 8 and 9 are cross-sectional views of the coaxial contact and the coaxial cable shown in FIG. 6.
Figure 9:
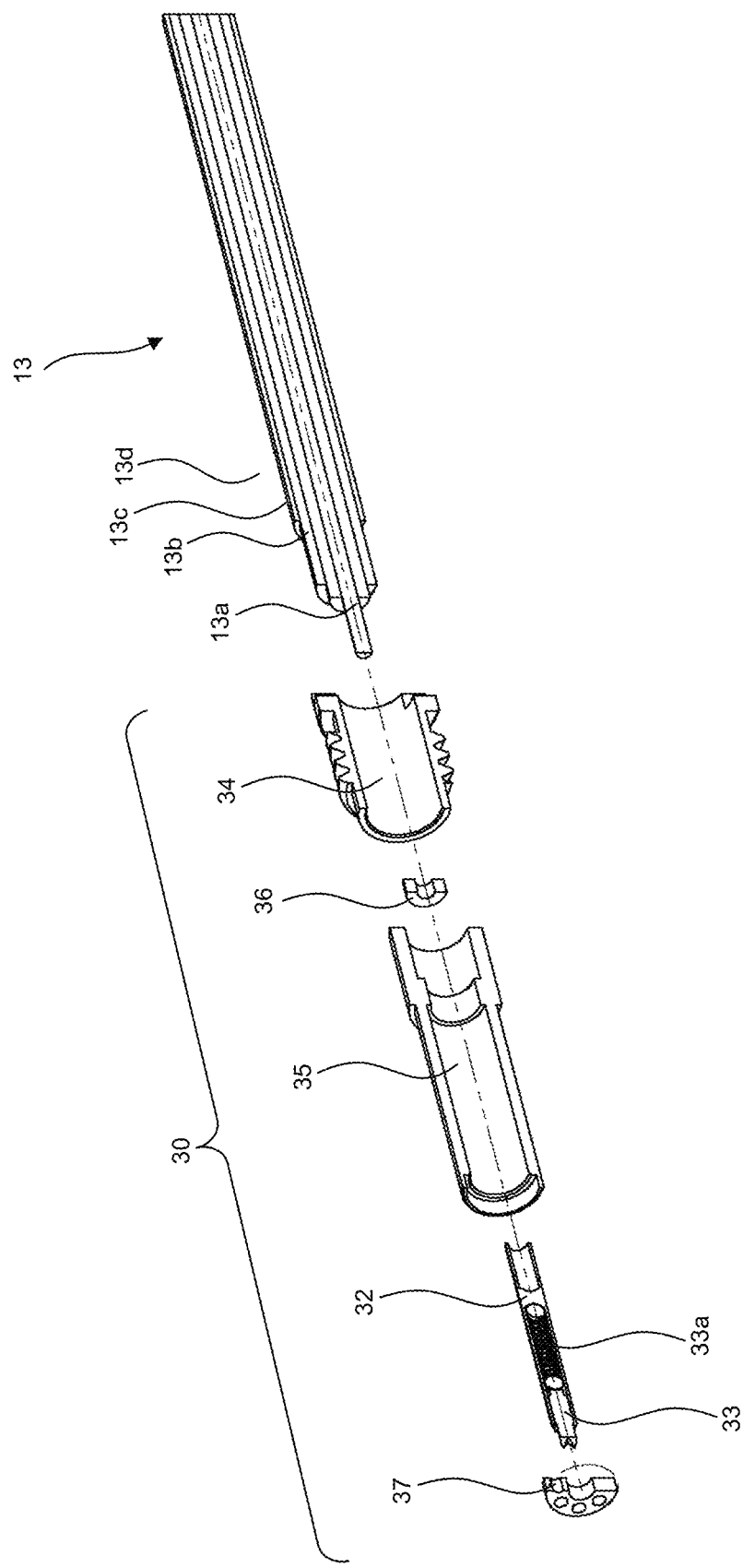

FIG. 6 is a perspective view of the coaxial contact 30 and the coaxial cable 13 according to the first preferred embodiment of the present invention, and FIG. 7 is an exploded perspective view of the coaxial contact 30 and the coaxial cable 13. FIGS. 8 and 9 are cross-sectional views of the coaxial contact 30. Each of the coaxial cables 13 shown in FIGS. 1, 2, 4, and 5 is terminated to a corresponding coaxial contact 30. The coaxial cables 13 include a center conductor 13a, an insulator 13b, an external conductor 13c, and a jacket 13d. The center conductor 13a is surrounded by the insulator 13b, the insulator 13b is surrounded by the external conductor 13c, and the external conductor 13c is surrounded by the jacket 13d. Each of the coaxial contacts 30 includes a signal probe 32 with a probe tip 33 and a probe spring 33a, a locking ferrule 34, a ground ferrule 35, a positioning puck 36, and a dielectric puck 37.

The center conductor 13a and the external conductor 13c are conductive elements of the coaxial cable 13. The center conductor 13a is arranged to carry electrical signals, whereas the external conductor 13c typically provides a ground connection. The external conductor 13c also provides electrical isolation for the center conductor 13a and reduces crosstalk between neighboring center conductors 13a of neighboring coaxial cables 13.

The center conductor 13a preferably has a cylindrical or substantially cylindrical shape. However, the center conductor 13a could have a rectangular shape or other suitable shape. The center conductor 13a and the external conductor 13c are preferably made of copper. However, the center conductor 13a and the external conductor 13c can be made of brass, silver, gold, copper alloy, any highly conductive element that is machinable or manufacturable with a high dimensional tolerance, or any other suitable conductive material. The insulator 13b is preferably formed of a dielectric material with a constant or substantially constant cross-section to provide constant or substantially constant electrical properties for the center conductor 13a. The insulator 13b could be made of TEFLON™, FEP (fluorinated ethylene propylene), air-enhanced FEP, TPFE, nylon, combinations thereof, or any other suitable insulating material. The insulator 13b preferably has a round, oval, rectangular, or square cross-sectional shape, but may be formed or defined in any other suitable shape. The jacket 13d of the coaxial cable 13 protects the other layers of the coaxial cable 13 and prevents the external conductor 13c from coming into contact with other electrical components to significantly reduce or prevent occurrence of an electrical short. The jacket 13d can be made of the same materials as the insulator 13b, FEP, or any suitable insulating material.

As shown in FIGS. 7 to 9, a portion of the center conductor 13a, a portion of the insulator 13b, and a portion of the external conductor 13c are exposed before the coaxial cables 13 are connected to the corresponding coaxial contact 30. The center conductor 13a is connected to the signal probe 32 of the coaxial contact 30. Preferably, the signal probe 32 includes a probe tip 33 that extends from a distal end of the coaxial contact 30 due to the force of the probe spring 33a and that engages with a corresponding one of the sub-contact points 53 on the substrate 50 when the coaxial contact 30 is fully inserted into the connector body 15. The center conductor 13a is preferably fusibly connected (for example, by solder) to the signal probe 32 to ensure an uninterrupted electrical connection. However, it is possible to use other suitable methods to connect the center conductor 13a to the signal probe 32, e.g., crimping, sonically welding, conductive soldering, convective soldering, inductive soldering, radiation soldering, otherwise melting solder to hold the two parts together, pushing the two parts together with enough force to weld the two parts together, or micro-flaming. Preferably, the external conductor 13c is connected with the ground ferrule 35 in a similar manner as the center conductor 13a and the signal probe 32.

In addition to the crown shape of the probe tip 33 of the signal probe 32 shown in FIGS. 6 to 9, the probe tip 33 may have a simple pointed shape or any other suitable type of tip. Preferably, the crown shape is used for the probe tip 33 to provide multiple points of mechanical contact with a corresponding contact point 53 on the substrate 50 to which the signal probe 32 is making the mechanical and electrical connection, whereas a tip with a simple pointed shape only provides a single mechanical contact. The use of multiple points of mechanical contact improves the electrical transmission characteristics of the signal probe 32. Further, the multiple tips of the crown shape of the probe tip 33 allow for the signal probe 32 to more easily break through the oxide layer formed on the corresponding contact point 53 on the substrate 50. If any dirt or debris is present on the corresponding contact point 53 on the substrate 50, the multiple tips of the crown shape of the probe tip 33 increase the chance that one of the tips misses the dirt or debris to make electrical and mechanical contact with the corresponding electrical contact 53. The signal probe 32 and the ground ferrule 35 are preferably made of beryllium copper (BeCu) or brass with the probe tip 33 being gold plated so that the probe tip 33 can penetrate any oxide layer on the contact point 53 of the substrate 50, but any other suitable conductor or plating could be used.

As shown in FIG. 8, the signal probe 32, the ground ferrule 35, the positioning puck 36, and the dielectric puck 37 are arranged such that a coaxial structure, similar to that of the coaxial cables 13, is maintained throughout the coaxial contact 30. More specifically, the signal probe 32 is surrounded by the ground ferrule 35, similar to the arrangement of the center conductor 13a and the external conductor 13c of the coaxial cable 13. The signal probe 32 is connected to the center conductor 13a; the positioning puck 36 of the coaxial contact 30 is connected to the insulator 13b of the coaxial cable 13; the ground housing 35 is connected to external conductor 13c; and the dielectric puck 37 is connected to the ground ferrule 35. The positioning puck 36 and the dielectric puck 37 locate and stabilize the signal probe 32 within the ground ferrule 35 such that the signal probe 32 is centered or substantially centered, in a longitudinal direction, within the ground ferrule 35.

As shown in FIGS. 6 and 8, the probe tip 33 of the signal probe 32 preferably extends from the bottom of the coaxial contact 30 and at least partially retracts into the signal probe 32 when the coaxial contact 30 is inserted into the connector body 15 attached to the substrate 50. The probe tip 33 extends from the bottom of the coaxial contact 30 due to the force of the probe spring 33a, and the probe spring 33a is compressed when the probe tip 33 retracts into the signal probe 32. The coaxial contact 30 can also be inserted into the connector body 15 before the connector 10 is attached to the substrate 50. Particularly, the contact point 53 of the substrate 50 presses against the probe tip 33 and pushes it into the body of the signal probe 32. Preferably, the probe spring 33a is made of steel or other suitable material and has bias balls arranged at each end thereof to electrically isolate the probe spring 33a from the probe tip 33.

As shown in FIGS. 4 to 7 and 10, the locking ferrule 34 includes an external threading that engages with internal threadings in the contact holes 15b of the connector body 15. Accordingly, when the locking ferrule 34 is fully screwed into the connector body 15, the external threading of the locking ferrule 34 and a corresponding internal threading in the connector body 15 fasten the coaxial contact 30 to the connector body 15. Further, the threaded connection between the coaxial contacts 30 and the connector body 15 permits the coaxial contacts 30 to be easily inserted into and easily withdrawn from the connector body 15, which allows the coaxial connector 10 to be easily repaired and the coaxial contacts 30 to be easily replaced. Furthermore, the stable and secure connection provided by the thread arrangement of the locking ferrule 34 and the contact holes 15b compensates for slight variations in the components of the coaxial connector 10, which allows the coaxial connector 10 to be manufactured with relatively high manufacturing tolerances. The threaded connection between the coaxial contacts 30 and the connector body 15 also helps to prevent the coaxial contact 30 from shifting or rocking within the connector body 15, thereby avoiding any excessive movement of the coaxial contact 30 and the coaxial cable 13 which could lead to problems with the electrical characteristics of the coaxial contact 30 and the coaxial cable 13. Preferably, the locking ferrule 34 is freely rotatable over the coaxial cable 13 and adjacent to the ground ferrule 35, such that only the locking ferrule 34, and not the entire coaxial contact 30, is rotated to engage the external threading of the locking ferrule 34 with the corresponding internal threading in the connector body 15.

Preferably, when the locking ferrule 34 is fully screwed into the connector body 15, the coaxial contact 30 is arranged so that the ground ferrule 35 touches or comes in close proximity to at least one of the interface 17 and the ground plane 57 on the upper surface of the substrate 50 to provide shielding of signals transmitted through the signal probe 33 along the entire or substantially the entire length of the signal probe 32, as shown in FIGS. 4 and 5. A stable electrical and mechanical connection between the probe tip 33 of the coaxial contact 30 and the contact point 35 of the substrate 50 is obtained because of the threadings on the locking ferrule 34 and in the contact holes 15b providing a relatively consistent distance when the coaxial contact 30 is inserted into the connector body 15. Preferably, a distance between the ground ferrule 35 and the ground plane 57 on the upper surface of the substrate 50 is between about 0.0040" and 0.0070". The ground ferrule 35 is preferably fixed to the external connector 13c of the coaxial cable 13 to restrict movement of the ground ferrule 35 with respect to the external connector 13c and to maintain a consistent high signal integrity. More specifically, the arrangement of the ground ferrule 35 with respect to the coaxial cable 13, in addition to the stable, threaded connection between the locking ferrule 34 and the connector body 15, helps to maintain a relatively consistent direct-current resistance to ground for the coaxial cable 13.

According to the arrangement of the ground ferrule 35 touching or coming in close proximity to at least one of the interface 17 and the ground plane 57 on the upper surface of the substrate 50, insertion loss and return loss are reduced, thereby providing consistent signal integrity for the coaxial connector 10 even when one or more of the coaxial contacts 30 is replaced with a new coaxial contact 30. Preferably, the interface 17 is compressible to maintain an electrical and mechanical connection to ground for the ground ferrule 53 of the coaxial contact 30 and to increase the amount of the signal probe 32 that is surrounded by grounded elements. Further, the interface 17 compensates for any variances in the dimensions of the other components of the coaxial connector 10 due to manufacturing tolerances and the like. Thus, according to the ground connection provided in the coaxial connector 10, impedances of the coaxial contacts 30 are able to be controlled before the coaxial contacts 30 are fully inserted into the connector body 15, thereby increasing signal integrity.

As shown in FIGS. 6 to 9, the dielectric puck 37 preferably includes holes so that the dielectric puck 37 has a dielectric constant closer to that of the air gap between the signal probe 32 and the ground ferrule 35 in order to improve signal integrity and reduce impedance discontinuities. The dielectric puck 37 is preferably made of FEP, PET, PTFE, or a hard plastic, but can also be made of any other suitable insulating material. The holes in the dielectric puck 37 may be resized, removed, or otherwise rearranged to tune the impedance of the electrical connector in the transition zone where the insulator 13b, external conductor 13c, and jacket 13d have been stripped from the center conductor 13a.

Preferably, the positioning puck 36 includes a dielectric material, such as a dielectric foam, to insulate the center conductor 13a of the coaxial cable 13 from the ground ferrule 35 of the coaxial contact 30. However, the positioning puck 36 may be made of any other suitable material for impedance matching and stabilizing the signal probe 32, including any of the materials preferably used to make the dielectric puck 37. Further, the positioning puck 35 may include holes similar to the dielectric puck 37.

Preferably, the gap between the signal probe 32 and the ground ferrule 35 is an air gap, except for the positioning puck 36 and the dielectric puck 37, to provide a high dielectric constant between the signal probe 32 and the ground ferrule 35. Accordingly, the gap between the signal probe 32 and the ground ferrule 35 may be made relatively small, which increases the density of coaxial contacts 30 that can be included in the coaxial connector 10. Particularly, by including air as a dielectric between the signal probe 32 and the ground ferrule 35, the coaxial contacts may be smaller than the pogo pin connector 130 shown in FIG. 16, due to mechanical limitations related to the structure of the spring-loaded shield 135 and the shield sheath 136. However, the gap between the signal probe 32 and the ground ferrule 35 may alternatively include any suitable insulating material with a high dielectric constant.

Figure 10:
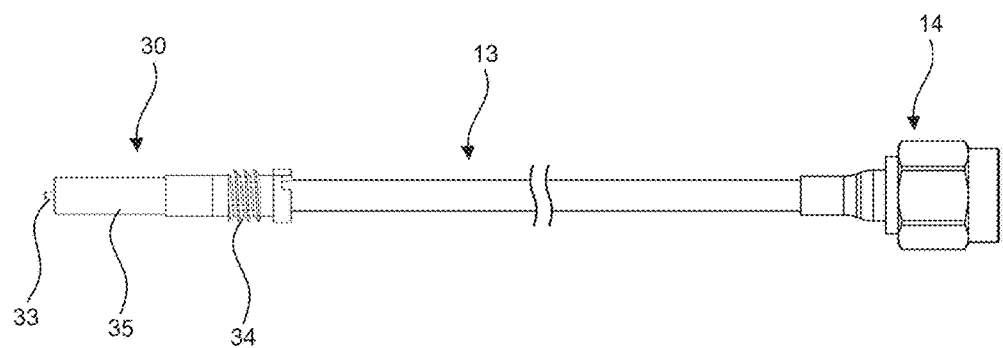
FIG. 10 is a side view of the coaxial contact shown in FIG. 6 and an end connector connected to the coaxial cable according to the first preferred embodiment of the present invention.
Figure 11A:
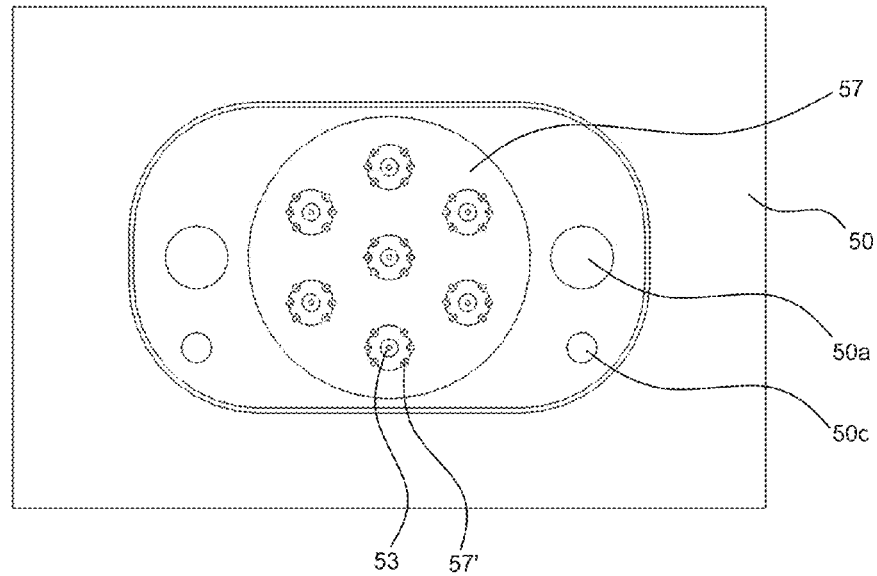
FIGS. 11A and 11B are top and bottom planar views of the substrate according to the first preferred embodiment of the present invention.
Figure 11B:
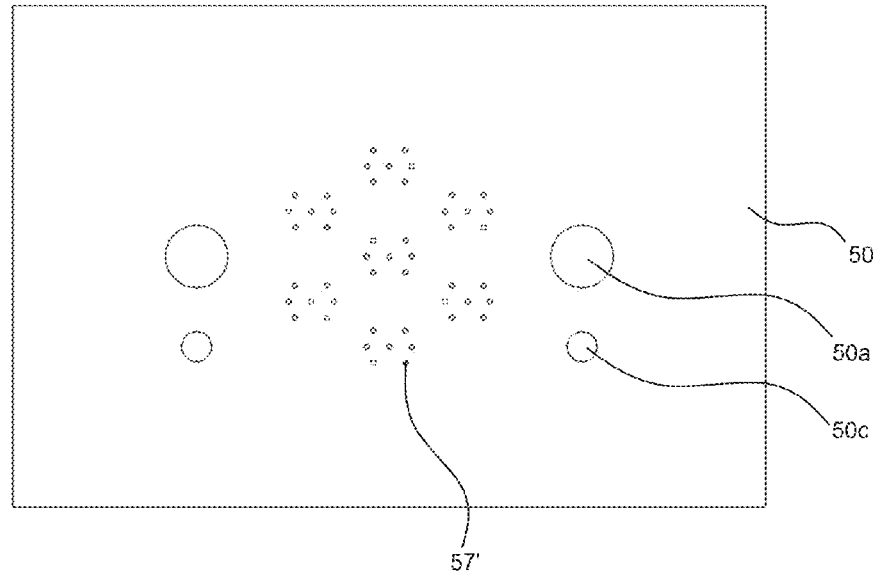

FIG. 10 is a side view of the coaxial contact 30 shown in FIG. 6 and an end connector 14 according to the first preferred embodiment of the present invention. As shown in FIG. 10, the coaxial cable 13 is preferably terminated on each of its ends by the coaxial contact 30 at a first end of the coaxial cable 13 and the end connector 14 at a second end of the coaxial cable 13. Typically, 2.92 or 1.8 SMA or MSMP connectors are used as the end connectors 14. However, any other suitable end connector can also be used. The end connectors 14 are preferably connected to, for example, test equipment (not shown).

Although the first preferred embodiment of the present invention preferably includes the coaxial cable 13, other types of cables or wiring may be used, for example, a shielded coaxial cable, a twinaxial cable, a twisted pair cable, a shielded twinaxial cable, a shielded twisted pair cable, a ribbonized coaxial cable, and the like.

Figure 14:
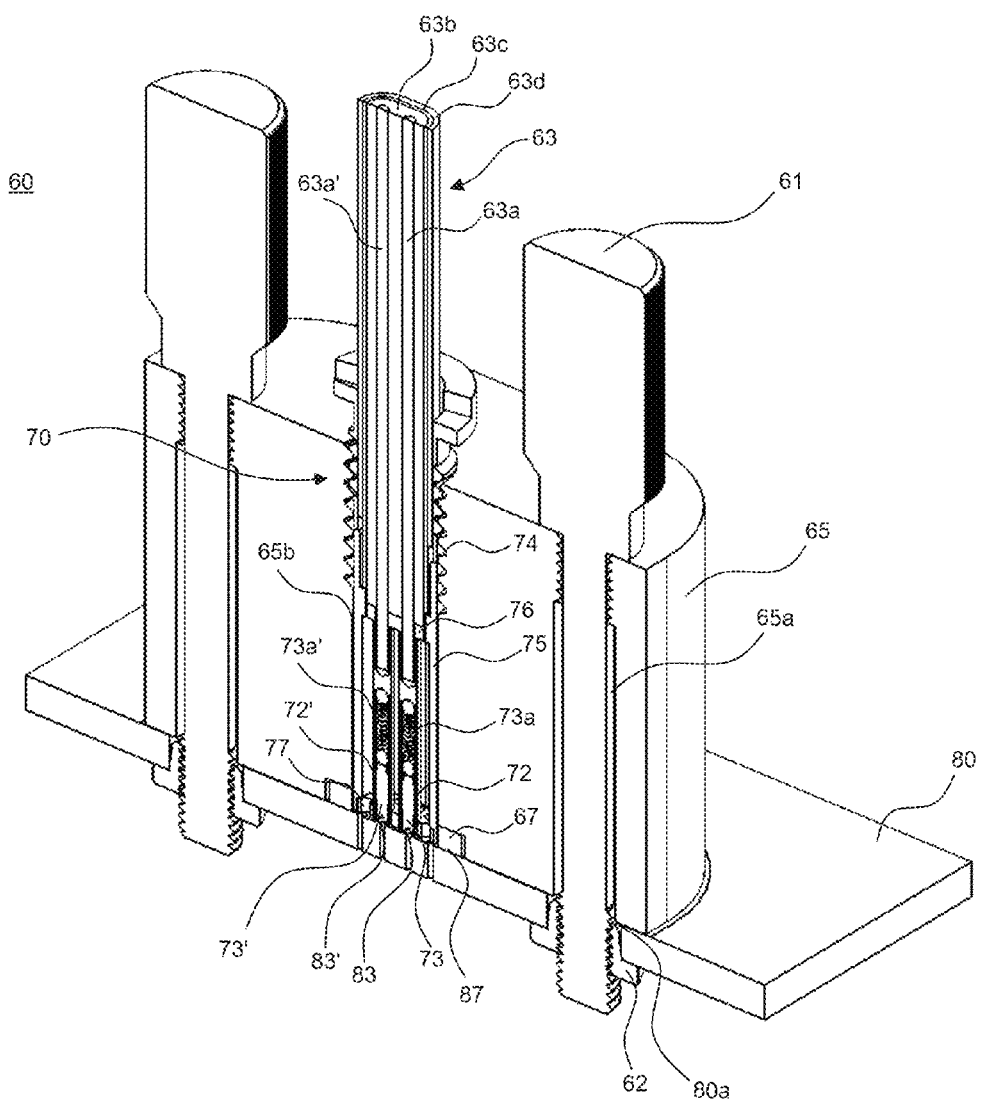
Figure 15:
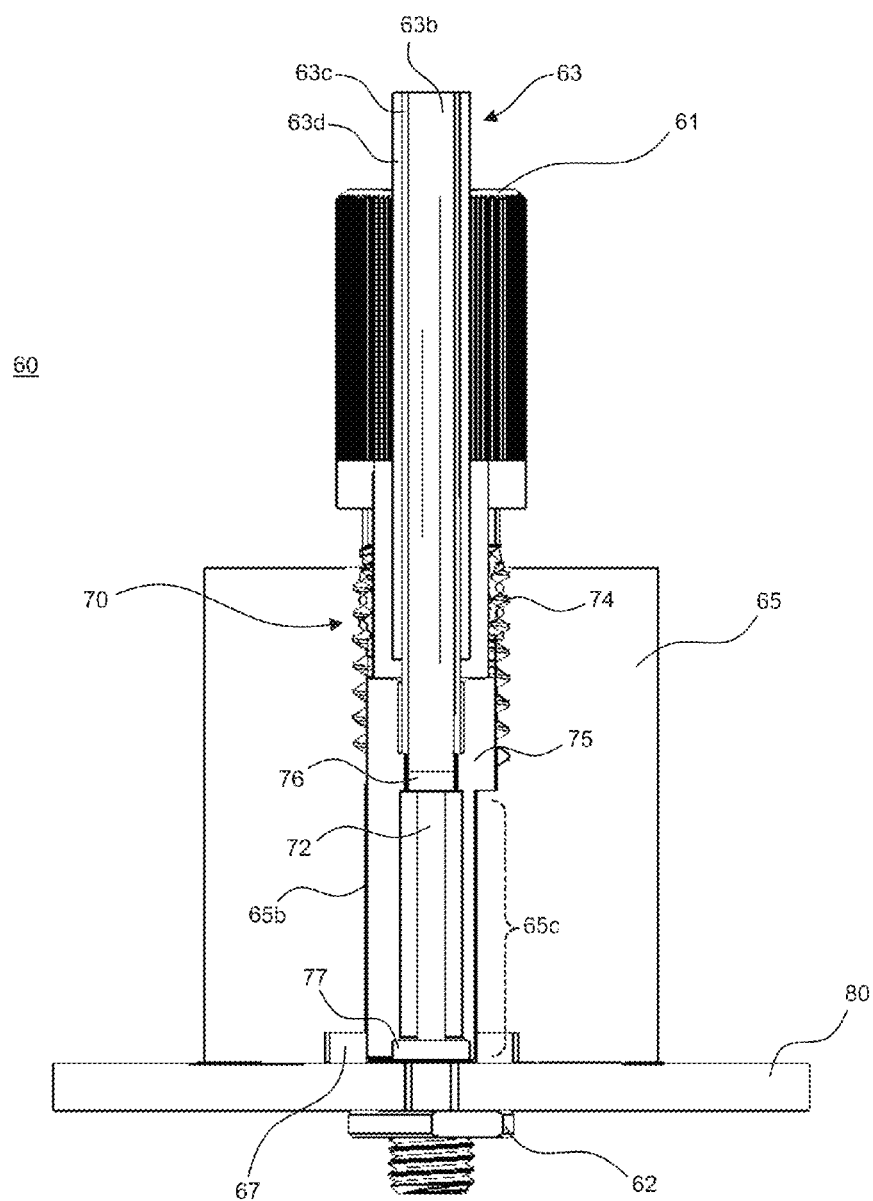
Figure 16:
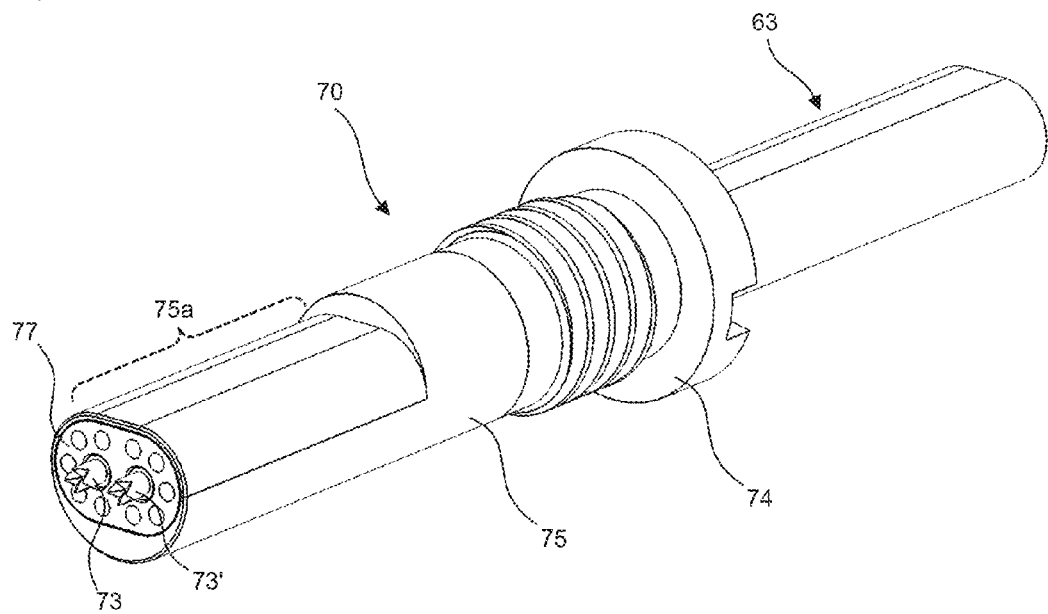
FIG. 16 is a perspective view of a twinaxial contact and twinaxial cable according to the second preferred embodiment of the present invention.
Figure 17:
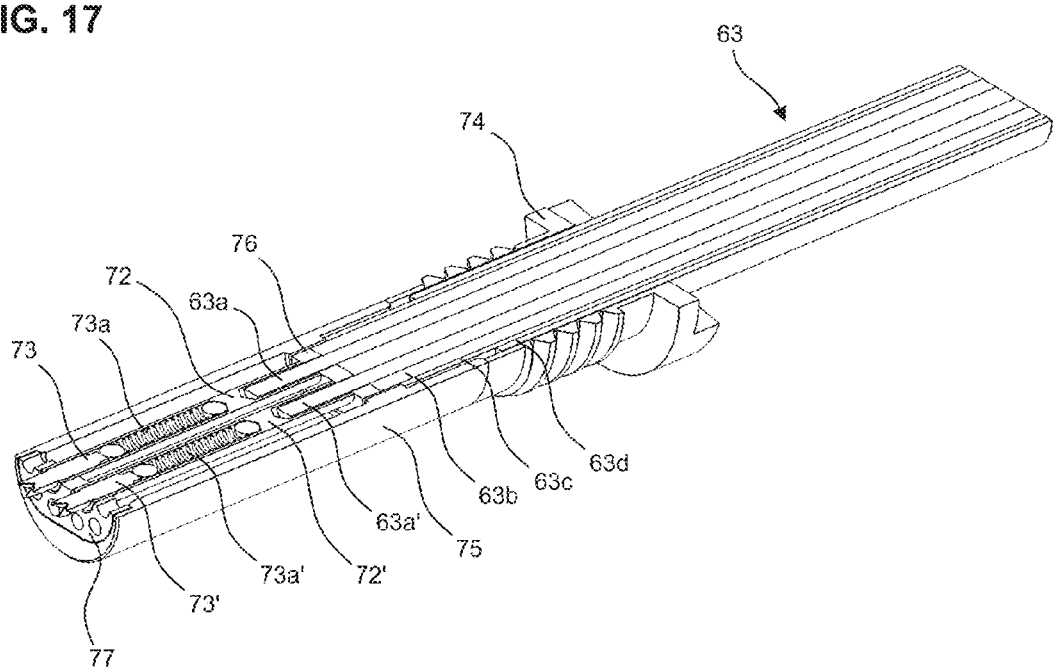
FIG. 17 is a cross-sectional view of the twinaxial contact and the twinaxial cable shown in FIG. 16.
Figure 18:
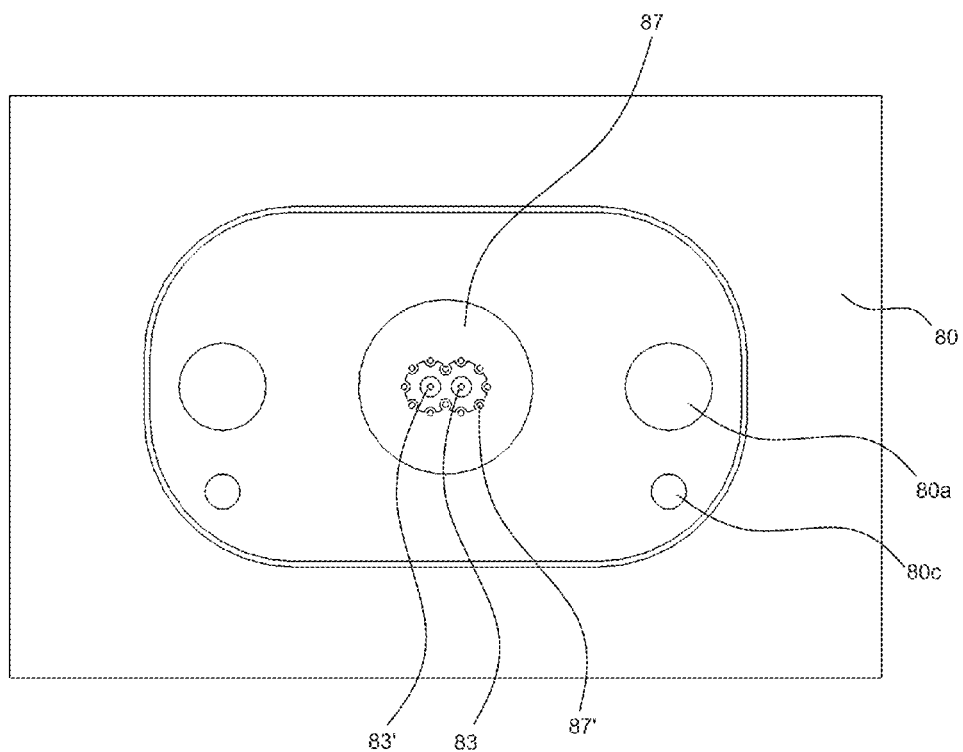
FIG. 18 is a top planar view of the substrate according to the second preferred embodiment of the present invention.
Figure 19:
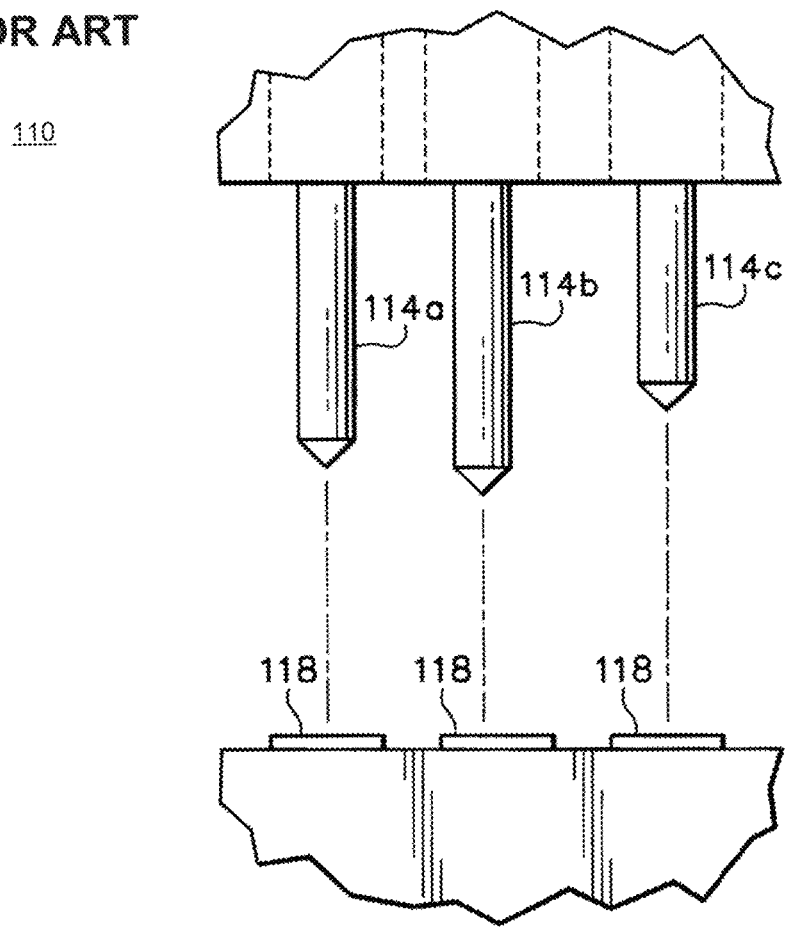
FIGS. 19 and 20 are side views a conventional pogo pin connector.
Figure 20:
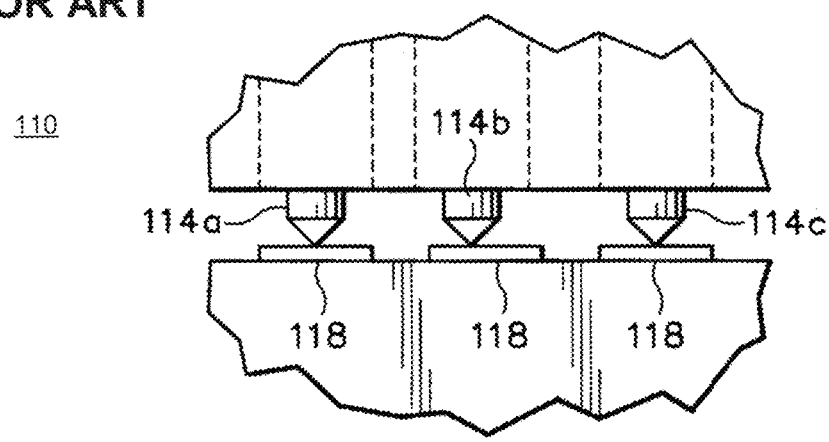
Figure 21:
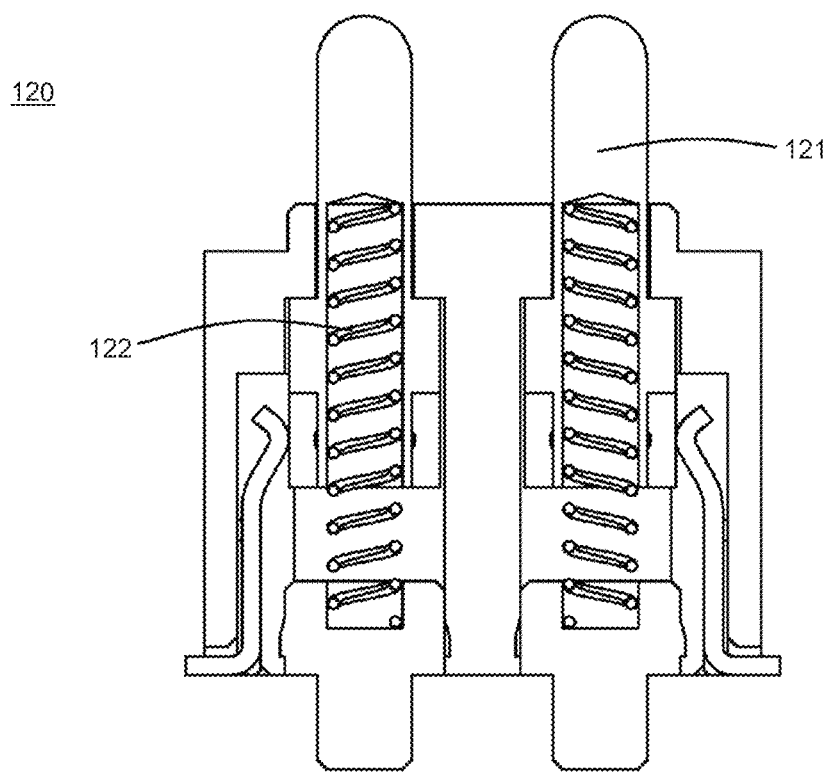
FIG. 21 is a side view of a conventional pogo pin contact.
Figure 22:
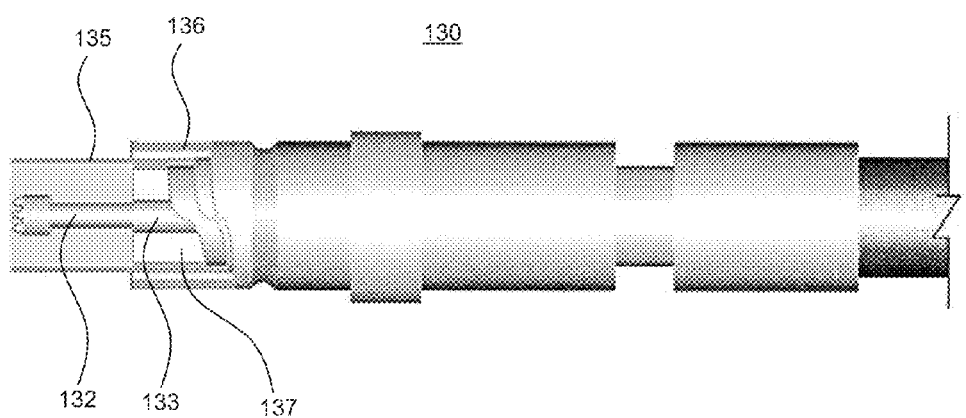
FIG. 22 is a side view of a conventional pogo pin connector with a spring-loaded shield.

FIGS. 12 to 15 show a twinaxial connector 60 in accordance with a second preferred embodiment of the present invention. FIGS. 16 and 17 show a twinaxial contact 70 and a twinaxial cable 63 according to the second preferred embodiment of the present invention. FIG. 18 is a top planar view of a substrate 80 according to the second preferred embodiment of the present invention. In contrast with the first preferred embodiment of the present invention that provides a coaxial connection for a signal transmitted along a single conductor, the second preferred embodiment of the present invention provides a twinaxial connection for a differential signal transmitted along two conductors.

As shown in FIGS. 12 to 15, the twinaxial connector 60 includes a twinaxial cable 63, a twinaxial contact 70, and a connector body 65. Although only one twinaxial cable 63 and one twinaxial contact 70 are shown in FIGS. 12 to 15, additional twinaxial cables and contacts may be included in the twinaxial connector 60, similar to the coaxial connector 10 described above with respect to the first preferred embodiment of the present invention.

Figure 12:
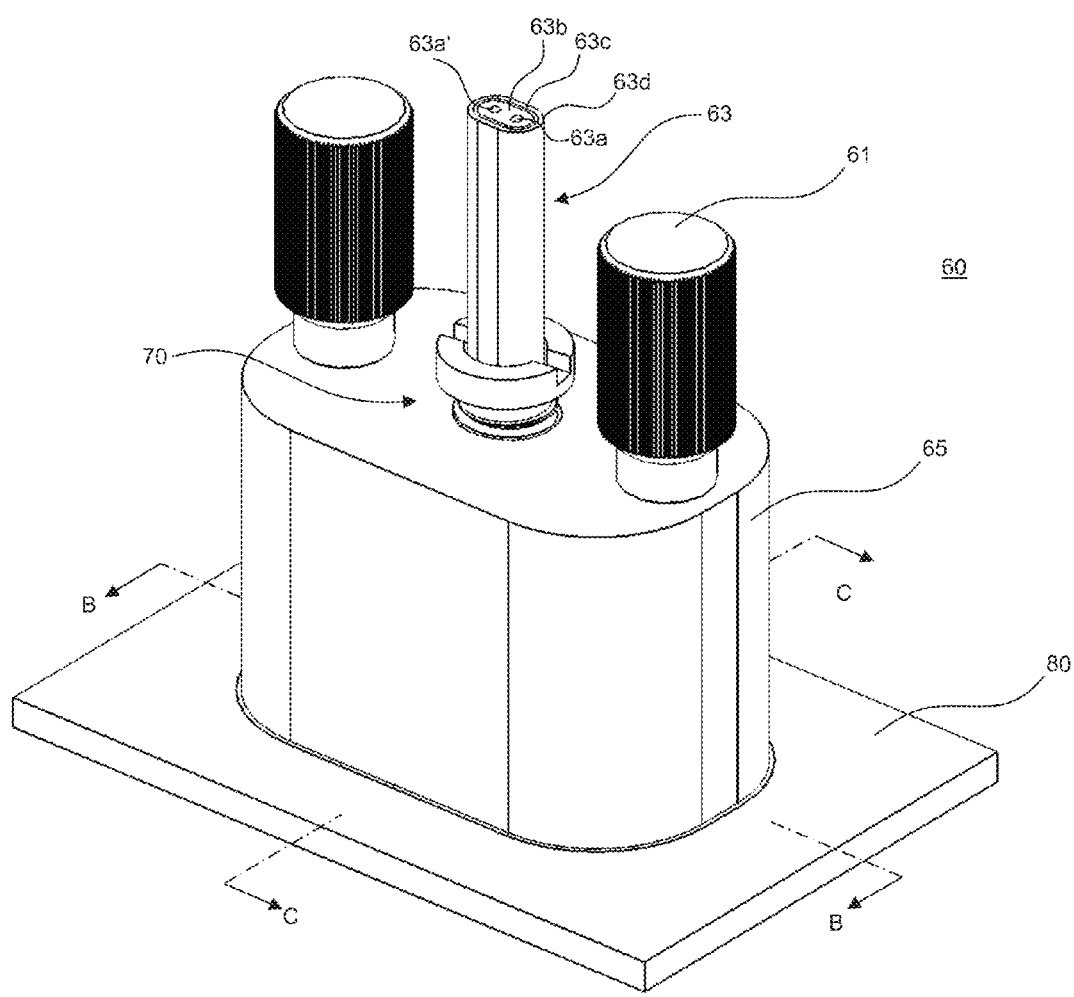
FIG. 12 is a perspective view of a twinaxial connector according to a second preferred embodiment of the present invention.
Figure 13:
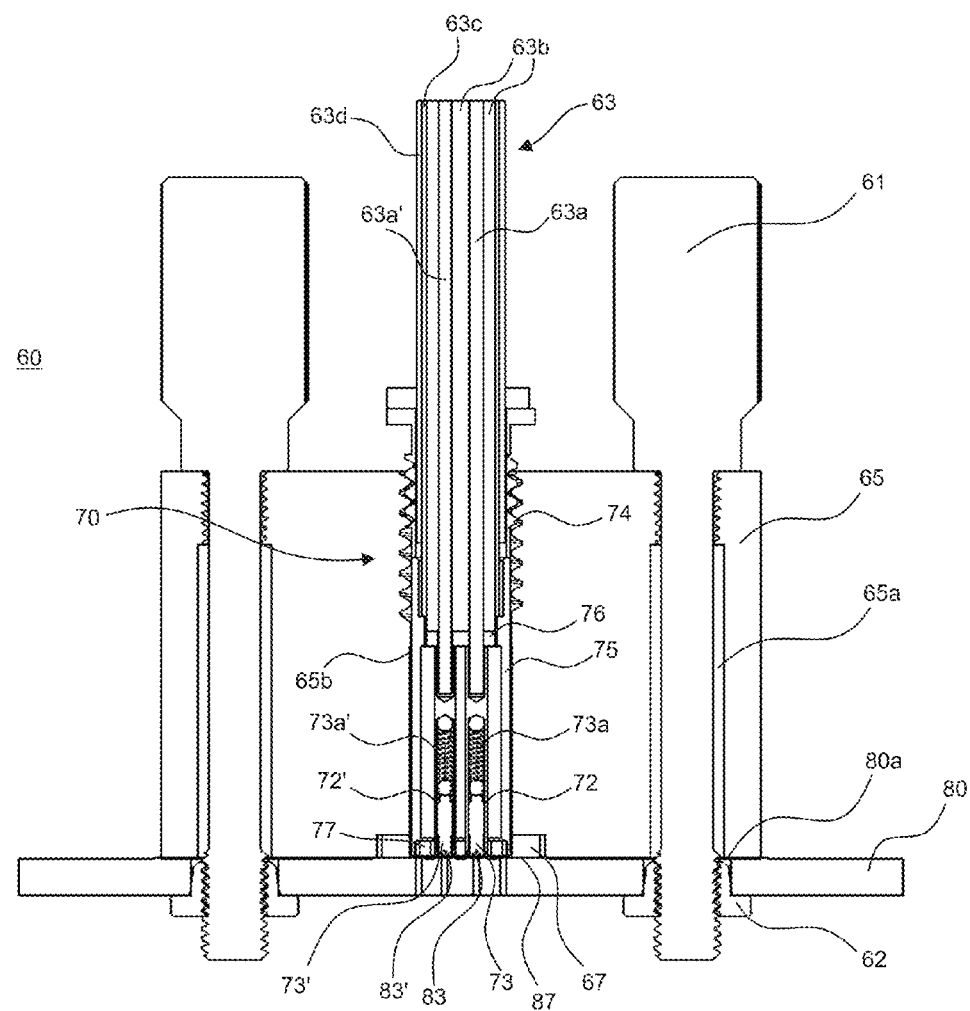
FIGS. 13 to 15 are cross-sectional views of the twinaxial connector shown in FIG. 12.

FIG. 12 is a perspective view of the twinaxial connector 60. The connector body 65 of the twinaxial connector 60 is attached to a substrate 80. The substrate 80 is preferably a printed circuit board, but other suitable substrates could be used. The connector body 65 is preferably attached to the substrate 80 by a pair of thumb screws 61 and bosses 62, as shown in FIGS. 13 to 15. However, only one thumb screw could be used, or more than two could be used. Preferably, as shown in FIGS. 13 and 14, the thumb screws 61 are externally threaded at a lower portion thereof, and the bosses 62 are standoffs that are internally threaded and press fit to the substrate 80. However, any other suitable attachment mechanism can also be used. For example, instead of using thumb screws 61 and bosses 62, the connector body 65 can be connected to the substrate 80 by rivets or any other suitable connecting method, including RF connectors, through-hole connectors, other threaded connectors, quarter-turn connectors, ratcheted thread locks, spring-loaded connectors, pull-back-to-unlatch connectors, and the like. The connector body 65 of the twinaxial connector 60 preferably includes two screw holes 65a at opposing ends of the connector body 65 for retaining the thumb screws 61, and one or more contact holes 65b in the middle or substantially in the middle of the connector body 65 for retaining the twinaxial contact 70. This arrangement of holes in the connector body 65 allows for an equal or substantially equal compression force throughout the twinaxial connector 60 when the connector body 65 is attached to the substrate 80 by the thumb screws 61 and bosses 62. However, it is possible to use different arrangements of the holes in the connector body 65. The substrate 80 includes holes 80a that are arranged in a similar manner as the screw holes 65a in the connector body 65, and includes contact points 83 that are aligned with the one or more holes 65b in the middle or substantially in the middle of the connector body 65 for retaining the twinaxial contact 70.

The bosses 62 are inserted into the holes 80a in the substrate 80, and the thumb screws 61 are inserted into the screw holes 65a in the connector body 65 and screwed into the bosses 62. The bosses 62 are preferably pressed into the holes 80a in the substrate 80, which prevents the bosses 62 from turning when the thumb screws 61 are inserted and screwed into the bosses 62. Preferably, the bosses 62 have been tapped so that the thumb screws 61 are easily screwed into the bosses 62.

FIGS. 13 and 14 are cross-sectional views taken along line B-B of the twinaxial connector 60 shown in FIG. 12, and FIG. 15 is a cross-section view taken along line C-C of the twinaxial connector 60 shown in FIG. 12. An interface 67 including a conductive elastomeric material is preferably arranged between the connector body 65 and the substrate 80. The interface 67 is preferably fit in a recess of the connector body 65. Furthermore, the interface 67 preferably includes one or more holes arranged near the edges of the interface 67 that engage with corresponding posts of the connector body 65, and one or more holes in the middle or substantially in the middle of the interface 67 for retaining the twinaxial contact 70, similar to the holes in the interface 17 of the first preferred embodiment of the present invention as shown in FIGS. 2 and 3. However, any other suitable method of attaching the interface 67 to the connector body 65 can also be used. The interface 67 is preferably made of fluorosilicone with a filler of silver or aluminum particles with a Shore A hardness of about 70. However, other suitable materials, filler metals, and hardnesses can also be used. Preferably, the interface 67 is connected to a ground plane 87 included on an upper surface of the substrate 80. However, the interface 67 can also be connected to an external ground or another ground connection in the substrate 80.

As shown in FIG. 18, the ground plane 87 preferably includes one or more via holes 87' that penetrate through the substrate 80 and provide a connection to ground for the ground plane 87.

The connector body 65 preferably includes pegs, similar to the pegs 15c of the connector body 10 of the first preferred embodiment of the present invention as shown in FIG. 3, that engage with peg holes 80c in the substrate 80 to align the connector body 65 to the substrate 80 prior to the thumb screws 61 being screwed into the bosses 62. Preferably, the pegs are arranged asymmetrically on the connector body 65 so that the connector body 65 is only able to be positioned on the substrate 80 in a single orientation and so that the twinaxial contact 70 is properly arranged to connect with the corresponding contact points 83 and 83' on the substrate 80. The thumb screws 61 provide quick attachment and detachment of the twinaxial connector 60 from the substrate 80, which allows the elements of the twinaxial connector 60 to be easily replaced or repaired.

FIG. 16 is a perspective view of the twinaxial contact 70 and the twinaxial cable 63 according to the second preferred embodiment of the present invention, and FIG. 17 is a cross-sectional view of the twinaxial contact 70. The twinaxial cable 63 includes two center conductors 63a and 63a', an insulator 63b, an external conductor 63c, and a jacket 63d. The center conductors 63a and 63a' are surrounded by the insulator 63b, the insulator 63b is surrounded by the external conductor 63c, and the external conductor 63c is surrounded by the jacket 63d. The twinaxial contact 70 includes two signal probes 72 and 72' with respective probe tips 73 and 73' and probe springs 73a and 73a', a locking ferrule 74, a ground ferrule 75, a positioning puck 76, and a dielectric puck 77.

The center conductors 63a and 63a' and the external conductor 63c are conductive elements of the twinaxial cable 63. The center conductors 63a and 63a' are arranged to carry electrical signals, whereas the external conductor 63c typically provides a ground connection. The external conductor 63c also provides electrical isolation for the center conductors 63a and 63a' and reduces crosstalk with neighboring center conductors of neighboring coaxial or twinaxial cables.

The center conductors 63a and 63a' preferably have cylindrical or substantially cylindrical shapes. However, the center conductors 63a and 63a' could have rectangular shapes or other suitable shapes. The center conductors 63a and 63a', the insulator 63b, the external conductor 63c, and the jacket 63d are preferably made of the same materials as those described above with respect to the first preferred embodiment of the present invention.

As shown in FIGS. 13, 14, and 17, portions of the center conductors 63a and 63a', the insulator 63b, and the external conductor 63c are exposed before the twinaxial cable 63 is connected to the twinaxial contact 70. The center conductors 63a and 63a' are connected to the respective signal probes 72 and 72' of the twinaxial contact 70. Preferably, the signal probes 72 and 72' each include probe tips 73 and 73' that extend from a distal end of the twinaxial contact 70 due to the force of the probe springs 73a and 73a' and that engage with corresponding contact points 83 and 83' on the substrate 80 when the twinaxial contact 80 is fully inserted into the connector body 65. The center conductors 63a and 63a' are preferably fusibly connected (for example, by solder) to the signal probes 72 and 72' to ensure an uninterrupted electrical connection. However, it is possible to use other suitable methods to connect the center conductors 63a and 63a' to the signal probes 72 and 72', e.g., crimping, sonically welding, conductive soldering, convective soldering, inductive soldering, radiation soldering, otherwise melting solder to hold the two parts together, pushing the two parts together with enough force to weld the two parts together, or microflaming. Preferably, the external conductor 63c is connected with the ground ferrule 75 in a similar manner as the center conductor 63a and the signal probe 72.

In addition to the crown shape of the probe tips 73 and 73' of the signal probes 72 and 72' shown in FIGS. 16 and 17, the probe tips 73 and 73' may have a simple pointed shape or any other suitable type of tip, as described above with respect to the first preferred embodiment of the present invention.

As shown in FIGS. 13, 14, 16, and 17, the signal probes 72 and 72', the ground ferrule 75, the positioning puck 76, and the dielectric puck 77 are arranged such that a twinaxial structure, similar to that of the twinaxial cable 63, is maintained throughout the twinaxial contact 70. More specifically, the signal probes 72 and 72' are surrounded by the ground ferrule 75, similar to the arrangement of the center conductors 63a and 63a' and the external conductor 63c of the twinaxial cable 63. The signal probes 72 and 72' are connected to the center conductors 63a and 63a'; the positioning puck 76 of the twinaxial contact 70 is connected to the insulator 63b of the twinaxial cable 63; the ground housing 75 is connected to external conductor 63c; and the dielectric puck 77 is connected to the ground ferrule 75. The positioning puck 76 and the dielectric puck 77 locate and stabilize the signal probes 72 and 72' within the ground ferrule 75.

As shown in FIGS. 16 and 17, the probe tips 73 and 73' of the signal probes 72 and 72' preferably extend from the bottom of the twinaxial contact 70 and at least partially retract into the signal probes 72 and 72' when the twinaxial contact 70 is inserted into the connector body 65 attached to the substrate 80. The probe tips 73 and 73' extend from the bottom of the twinaxial contact 70 due to the force of the probe springs 73a and 73a', and the probe springs 73a and 73a' are compressed when the probe tips 73 and 73' retract into the signal probes 72 and 72'. The twinaxial contact 70 can also be inserted into the connector body 65 before the connector 60 is attached to the substrate 80. Particularly, the contact points 83 and 83' of the substrate 80 press against the probe tips 73 and 73' and pushes them into the bodies of the signal probes 72 and 72'. Preferably, the probe springs 73a and 73a' are made of steel or other suitable material and have bias balls arranged at each end thereof to electrically isolate the probe springs 73a and 73a' from the probe tips 73 and 73'.

As shown in FIGS. 13 to 17, the locking ferrule 74 includes an external threading that engages with an internal threading in the contact holes 65b of the connector body 65, similar to the locking ferrule 34 described above with respect to the first preferred embodiment of the present invention. Preferably, the locking ferrule 74 is freely rotatable over the twinaxial cable 63 and adjacent to the ground ferrule 75, such that only the locking ferrule 74, and not the entire twinaxial contact 70, is rotated to engage the external threading of the locking ferrule 74 with the corresponding internal threading in the connector body 65. Preferably, when the locking ferrule 74 is fully screwed into the connector body 65, the twinaxial contact 70 is arranged so that the ground ferrule 75 touches or comes in close proximity to at least one of the interface 67 and the ground plane 87 on the upper surface of the substrate 80 to provide shielding of signals transmitted through the signal probe 73 along the entire or substantially the entire lengths of the signal probes 72 and 72', as shown in FIGS. 13 to 15.

As shown in FIGS. 15 and 16, the twinaxial contact 70 preferably includes in indentation 75a in the ground ferrule 75 that engages with a corresponding protruding portion 65c in the contact hole 65b of the connector body 65. Accordingly, the indentation 75a and the protruding portion 65c ensure that the twinaxial contact 70 is inserted into the connector body 65 in the correct orientation so that the probe tips 73 and 73' properly engage with their corresponding contact points 83 and 83' on the substrate 80. However, other shapes, elements, or features may be included in the connector body 65 and the twinaxial contact 70 to ensure that the probe tips 73 and 73' properly engage with their corresponding contact points 83 and 83' on the substrate 80.

According to the arrangement of the ground ferrule 75 touching or coming in close proximity to at least one of the interface 57 and the ground plane 77 on the upper surface of the substrate 80, insertion loss and return loss are reduced, thereby providing consistent signal integrity for the twinaxial connector 60 even if the twinaxial contact 70 is replaced with a new twinaxial contact 70. Preferably, the interface 67 is compressible, similar to the arrangement described above with respect to the first preferred embodiment of the present invention. The positioning puck 76 and the dielectric puck 77 are preferably similar to the positioning puck 36 and the dielectric puck 37 described above with respect to the first preferred embodiment of the present invention, except that the positioning puck 76 and the dielectric puck 77 have elongated, preferably oval, shapes to engage with the signal probes 72 and 72' and the center conductors 63a and 63a'.

Preferably, the gap between the signal probes 72 and 72' and the ground ferrule 75 is an air gap, except for the positioning puck 76 and the dielectric puck 77, to provide a high dielectric constant between the signal probes 72 and 72' and the ground ferrule 75. However, the gap between the signal probes 72 and 72' and the ground ferrule 75 may alternatively include any suitable insulating material with a high dielectric constant.

According to the second preferred embodiment of the present invention, the twinaxial cable 63 is preferably terminated by an end connector on an end that is opposite to the end of the twinaxial cable 63 that includes the twinaxial contact 70. The end connector for the twinaxial cable 63 is preferably similar to the end connector 14 of the first preferred embodiment of the present invention, as shown in FIG. 10. However, any other suitable end connector can also be used for the twinaxial cable 63. The end connector of the twinaxial cable 63 is preferably connected to, for example, test equipment (not shown).

According to a modification the second preferred embodiment of the present invention, the center conductors 63a and 63a' may be formed as a twisted pair within the twinaxial cable 63 to further reduce crosstalk with neighboring center conductors of neighboring coaxial or twinaxial cables. Preferably, center conductor sheathes (not shown) are formed, respectively, on the center conductors 63a and 63a' to prevent an electrical connection between the center conductors 63a and 63a' when they are formed as a twisted pair.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A connector comprising:
   a connector body including a hole;
   a contact disposed in the hole and arranged such that, when the connector is connected to a substrate, the contact is connected to a corresponding electrical pad on the substrate;
   a conductive elastomeric interface arranged such that, when the connector is connected to the substrate, the conductive elastomeric interface is between the connector body and the substrate; and
   a cable connected to the contact; wherein
   the contact includes a ground ferrule and a locking ferrule arranged to mate with the hole;
   the hole of the connector body is at least partially threaded;
   the locking ferrule is at least partially threaded; and
   when the connector is connected to the substrate and when the locking ferrule is threaded with the hole, the ground ferrule contacts at least one of the conductive elastomeric interface and the upper surface of the substrate.

2. The connector according to claim 1, wherein the contact includes a signal probe connected to a conductor of the cable.

3. The connector according to claim 2, wherein the signal probe is located along or substantially along a central longitudinal axis of the ground ferrule.

4. The connector according to claim 2, wherein:
   the contact incudes a positioning puck that is arranged within the ground ferrule near an end of the ground ferrule that receives the cable; and
   the positioning puck at least partially surrounds the conductor of the cable.

5. The connector according to claim 2, wherein:
   the contact includes a dielectric puck that is arranged within the ground ferrule near an end of the ground ferrule opposite to an end of the ground ferrule that receives the cable; and
   the dielectric puck at least partially surrounds the signal probe.

6. The connector according to claim 5, wherein at least one hole is formed in the dielectric puck other than a hole formed to receive the signal probe.

7. The connector according to claim 2, wherein the signal probe includes a probe tip that at least partially extends, in a longitudinal direction, beyond a plane formed by an end of the ground ferrule that is opposite to an end of the ground ferrule that receives the cable.

8. The connector according to claim 7, wherein the probe tip at least partially retracts into the contact when the connector is connected to the substrate and the contact is connected to the corresponding electrical pad.

9. The connector according to claim 8, wherein the probe tip at least partially retracts into the contact due to a compressive stress between the signal probe and the corresponding electrical pad.

10. The connector according to claim 7, wherein:
    the signal probe includes a probe spring; and
    the signal probe at least partially extends beyond the plane formed by the end of the ground ferrule due to a spring force of the probe spring.

11. The connector according to claim 1, wherein the cable is a coaxial cable that includes a center conductor, an insulator, and an external conductor.

12. The connector according to claim 11, wherein:
    the contact includes a signal probe connected to the center conductor; and
    the ground ferrule is connected to the external conductor.

13. The connector according to claim 12, wherein the signal probe and the ground ferrule are arranged with a coaxial structure.

14. The connector according to claim 12, wherein the signal probe is soldered to the center conductor and the ground ferrule is soldered to the external conductor.

15. The connector according to claim 1, wherein the cable is a twinaxial cable that includes a first center conductor, a second center conductor, an insulator, and an external conductor.

16. The connector according to claim 15, wherein:
    the contact includes a first signal probe connected to the first center conductor and a second signal probe connected to the second center conductor; and
    the ground ferrule is connected to the external conductor.

17. The connector according to claim 16, wherein the first signal probe, the second signal probe, and the ground ferrule are arranged to form a twinaxial structure.

18. The connector according to claim 16, wherein:
    the first signal probe is soldered to the first center conductor, the second signal probe is soldered to the second center conductor, and the ground ferrule is soldered to the external conductor.

19. The connector according to claim 16, wherein:
    the first signal probe is arranged to connect to a first electrical pad on the substrate; and the second signal probe is arranged to connect to a second electrical pad on the substrate.

20. The connector according to claim 19, wherein:
    the contact includes an indented portion;
    the hole of the connector body includes a protruding portion; and
    when the contact is inserted into the hole of the connector body, the indented portion engages the protruding portion to orient the contact within the hole so that the first and second signal probes are respectively arranged to connect to the first and second electrical pads on the substrate.

21. The connector according to claim 1, wherein at least a portion of the contact is located in the conductive elastomeric interface.

22. The connector assembly according to claim 21, wherein the conductive elastomeric interface is connected to a ground plane or ground connection of the substrate.

23. The connector according to claim 1, wherein:
    the connector body includes at least one hole; and
    at least one screw inserted into a corresponding one of the at least one hole attaches the connector body to the substrate.

24. The connector according to claim 23, wherein the at least one hole includes a plurality of holes that are arranged such that an equal or substantially equal compression force is provided throughout the connector when the connector body is attached to the substrate.

25. The connector according to claim 1, wherein a second end of the cable is connected to an end connector.

26. A connector assembly comprising:
    test equipment; and
    the connector according to claim 25; wherein
    the end connector is connected to the test equipment.

27. A connector comprising:
    a connector body including a plurality of holes;

a plurality of contacts each disposed in a corresponding one of the plurality of holes and arranged such that, when the connector is connected to a substrate, each of the plurality of contacts is connected to a corresponding one of a plurality of electrical pads on the substrate;

a conductive elastomeric interface arranged such that, when the connector is connected to the substrate, the conductive elastomeric interface is between the connector body and the substrate; and a plurality of cables each connected to one of the plurality of contacts; wherein each of the plurality of contacts includes a ground ferrule and a locking ferrule arranged to mate with the corresponding one of the plurality of holes;

the plurality of holes of the connector body are at least partially threaded;

the locking ferrule of each of the plurality of contacts is at least partially threaded; and when the connector is connected to the substrate and when the locking ferrule each of the plurality of contacts is threaded with the corresponding one of the plurality of holes, the ground ferrule of each of the plurality of contacts engages at least one of the conductive elastomeric interface and the upper surface of the substrate.

* * * * *